United States Patent
Hayashi et al.

(10) Patent No.: US 11,539,011 B2
(45) Date of Patent: Dec. 27, 2022

(54) SOLID-STATE IMAGING ELEMENT AND ELECTRONIC DEVICE

(71) Applicant: SONY SEMICONDUCTOR SOLUTIONS CORPORATION, Kanagawa (JP)

(72) Inventors: Toshihiko Hayashi, Kanagawa (JP); Masahiro Joei, Kanagawa (JP); Kenichi Murata, Kanagawa (JP); Shintarou Hirata, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 162 days.

(21) Appl. No.: 17/260,880

(22) PCT Filed: Jun. 20, 2019

(86) PCT No.: PCT/JP2019/024472
§ 371 (c)(1),
(2) Date: Jan. 15, 2021

(87) PCT Pub. No.: WO2020/026636
PCT Pub. Date: Feb. 6, 2020

(65) Prior Publication Data
US 2021/0273187 A1    Sep. 2, 2021

(30) Foreign Application Priority Data
Jul. 30, 2018   (JP) .............................. JP2018-142986

(51) Int. Cl.
| | |
|---|---|
| *H01L 51/42* | (2006.01) |
| *H01L 27/146* | (2006.01) |
| *H01L 27/32* | (2006.01) |
| *H01L 27/30* | (2006.01) |

(52) U.S. Cl.
CPC ........ *H01L 51/4233* (2013.01); *H01L 27/146* (2013.01); *H01L 27/14609* (2013.01); *H01L 27/30* (2013.01); *H01L 27/3234* (2013.01)

(58) Field of Classification Search
CPC .......... H01L 51/4233; H01L 27/14609; H01L 27/3234; H01L 27/146; H01L 27/30
(Continued)

(56) References Cited

U.S. PATENT DOCUMENTS

| | | | |
|---|---|---|---|
| 9,917,140 B2* | 3/2018 | Sato ....................... | H01L 51/447 |
| 2012/0060906 A1* | 3/2012 | Myong ................. | H01L 31/075 |
| | | | 136/255 |

(Continued)

FOREIGN PATENT DOCUMENTS

| | | |
|---|---|---|
| JP | 2014-199913 | 10/2014 |
| JP | 2016-154229 | 8/2016 |

(Continued)

OTHER PUBLICATIONS

International Search Report prepared by the Japan Patent Office dated Aug. 13, 2019, for International Application No. PCT/JP2019/024472.

*Primary Examiner* — David Vu
*Assistant Examiner* — Brandon C Fox
(74) *Attorney, Agent, or Firm* — Sheridan Ross P.C.

(57) ABSTRACT

To provide a solid-state imaging element capable of further improving reliability. Provided is a solid-state imaging element including at least a first photoelectric conversion section, and a semiconductor substrate in which a second photoelectric conversion section is formed, in this order from a light incidence side, in which the first photoelectric conversion section includes at least a first electrode, a photoelectric conversion layer, a first oxide semiconductor layer, a second oxide semiconductor layer, and a second (Continued)

electrode in this order, and a film density of the first oxide semiconductor layer is higher than a film density of the second oxide semiconductor layer.

20 Claims, 13 Drawing Sheets

(58) Field of Classification Search
USPC .......................................................... 257/184
See application file for complete search history.

(56) References Cited

U.S. PATENT DOCUMENTS

| | | | |
|---|---|---|---|
| 2013/0061915 A1* | 3/2013 | Myong | H01L 31/076 |
| | | | 136/255 |
| 2013/0154041 A1* | 6/2013 | Kokubun | H01L 27/14685 |
| | | | 257/E31.127 |
| 2014/0183528 A1 | 7/2014 | Endo | |
| 2016/0240683 A1 | 8/2016 | Miyake et al. | |
| 2017/0005126 A1 | 1/2017 | Yamazaki et al. | |
| 2017/0162807 A1 | 6/2017 | Moriwaki | |

FOREIGN PATENT DOCUMENTS

| | | |
|---|---|---|
| JP | 2017-017324 | 1/2017 |
| JP | 2017-034039 | 2/2017 |
| JP | 2018-085402 | 5/2018 |
| WO | WO 2016/009693 | 1/2016 |

* cited by examiner

SOLID-STATE IMAGING ELEMENT AND ELECTRONIC DEVICE

TECHNICAL FIELD

The present technology relates to a solid-state imaging element and an electronic device.

BACKGROUND ART

These days, solid-state imaging elements such as charge-coupled device (CCD) image sensors or complementary metal oxide semiconductor (CMOS) image sensors are actively studied in order to achieve microminiaturization and image quality enhancement of digital cameras and the like.

For example, an imaging element having a stacked layer structure of a lower-layer semiconductor layer containing IGZO and an upper-layer photoelectric conversion layer is proposed (see Patent Document 1).

CITATION LIST

Patent Document

Patent Document 1: Japanese Patent Application Laid-Open No. 2017-157816

SUMMARY OF THE INVENTION

Problems to be Solved by the Invention

CROSS REFERENCE TO RELATED APPLICATIONS

This application is a national stage application under 35 U.S.C. 371 and claims the benefit of PCT Application No. PCT/JP2019/024472 having an international filing date of 20 Jun. 2019, which designated the United States, which PCT application claimed the benefit of Japanese Patent Application No. 2018-142986, filed 30 Jul. 2018, the entire disclosures of each of which are incorporated herein by reference.

However, the technology proposed by Patent Document 1 has a concern that further improvement in the reliability of the solid-state imaging element cannot be achieved.

Thus, the present technology has been made in view of such a situation, and a main object of the present technology is to provide a solid-state imaging element and an electronic device capable of further improving reliability.

Solutions to Problems

The present inventors conducted extensive studies in order to solve the object described above, and consequently have, surprisingly, succeeded in dramatically improving the reliability of the solid-state imaging element and have completed the present technology.

In the present technology, as a first aspect, first, there is provided a solid-state imaging element including at least a first photoelectric conversion section, and a semiconductor substrate, in which a second photoelectric conversion section is formed, in this order from a light incidence side, in which the first photoelectric conversion section includes at least a first electrode, a photoelectric conversion layer, a first oxide semiconductor layer, a second oxide semiconductor layer, and a second electrode in this order, and a film density of the first oxide semiconductor layer is higher than a film density of the second oxide semiconductor layer.

In the solid-state imaging element that is the first aspect of the present technology, a hydrogen concentration of the first oxide semiconductor layer may be lower than a hydrogen concentration of the second oxide semiconductor layer.

In the solid-state imaging element that is the first aspect of the present technology, the photoelectric conversion layer may contain at least one organic semiconductor material.

In the solid-state imaging element that is the first aspect of the present technology, the first photoelectric conversion section may further include an n-type buffer layer between the photoelectric conversion layer and the first oxide semiconductor layer.

In the solid-state imaging element that is the first aspect of the present technology, the first photoelectric conversion section may further include a p-type buffer layer between the first electrode and the photoelectric conversion layer.

In the solid-state imaging element that is the first aspect of the present technology, the first photoelectric conversion section may further include an n-type buffer layer between the photoelectric conversion layer and the first oxide semiconductor layer, and the first photoelectric conversion section may further include a p-type buffer layer between the first electrode and the photoelectric conversion layer.

In the present technology, as a second aspect, there is provided a solid-state imaging element including at least: a first photoelectric conversion section, and a semiconductor substrate in which a second photoelectric conversion section is formed, in this order from a light incidence side, in which the first photoelectric conversion section includes at least a first electrode, a photoelectric conversion layer, a first oxide semiconductor layer, a second oxide semiconductor layer, and a second electrode in this order, and a hydrogen concentration of the first oxide semiconductor layer is lower than a hydrogen concentration of the second oxide semiconductor layer.

In the solid-state imaging element that is the second aspect of the present technology, a film density of the first oxide semiconductor layer may be higher than a film density of the second oxide semiconductor layer.

In the solid-state imaging element that is the second aspect of the present technology, the photoelectric conversion layer may contain at least one organic semiconductor material.

In the solid-state imaging element that is the second aspect of the present technology, the first photoelectric conversion section may further include an n-type buffer layer between the photoelectric conversion layer and the first oxide semiconductor layer.

In the solid-state imaging element that is the second aspect of the present technology, the first photoelectric conversion section may further include a p-type buffer layer between the first electrode and the photoelectric conversion layer.

In the solid-state imaging element according to the second aspect of the present technology, the first photoelectric conversion section may further include an n-type buffer layer between the photoelectric conversion layer and the first oxide semiconductor layer, and the first photoelectric conversion section may further include a p-type buffer layer between the first electrode and the photoelectric conversion layer.

In the present technology, as a third aspect, there is provided a solid-state imaging element including at least a first photoelectric conversion section, and a semiconductor substrate in which a second photoelectric conversion section is formed, in this order from a light incidence side, in which the first photoelectric conversion section includes at least a first electrode, a photoelectric conversion layer, a first oxide semiconductor layer, a second oxide semiconductor layer, and a second electrode in this order, a film density of the first oxide semiconductor layer is higher than a film density of the second oxide semiconductor layer, and a hydrogen concentration of the first oxide semiconductor layer is lower than a hydrogen concentration of the second oxide semiconductor layer.

In the solid-state imaging element that is the third aspect of the present technology, the photoelectric conversion layer may contain at least one organic semiconductor material.

In the solid-state imaging element that is the third aspect of the present technology, the first photoelectric conversion section may further include an n-type buffer layer between the photoelectric conversion layer and the first oxide semiconductor layer.

In the solid-state imaging element that is the third aspect of the present technology, the first photoelectric conversion section may further include a p-type buffer layer between the first electrode and the photoelectric conversion layer.

In the solid-state imaging element according to the third aspect of the present technology, the first photoelectric conversion section may further include an n-type buffer layer between the photoelectric conversion layer and the first oxide semiconductor layer, and the first photoelectric conversion section may further include a p-type buffer layer between the first electrode and the photoelectric conversion layer.

In the present technology, as a fourth aspect, there is provided an electronic device including a solid-state imaging element that is any one aspect among the solid-state imaging elements that are the first aspect to the third aspect of the present technology.

Effects of the Invention

According to the present technology, the reliability of a solid-state imaging element can be improved. Note that the effect described herein is not necessarily a limitative one, and any of the effects described in the present disclosure is possible.

MODE FOR CARRYING OUT THE INVENTION

Figure 1:
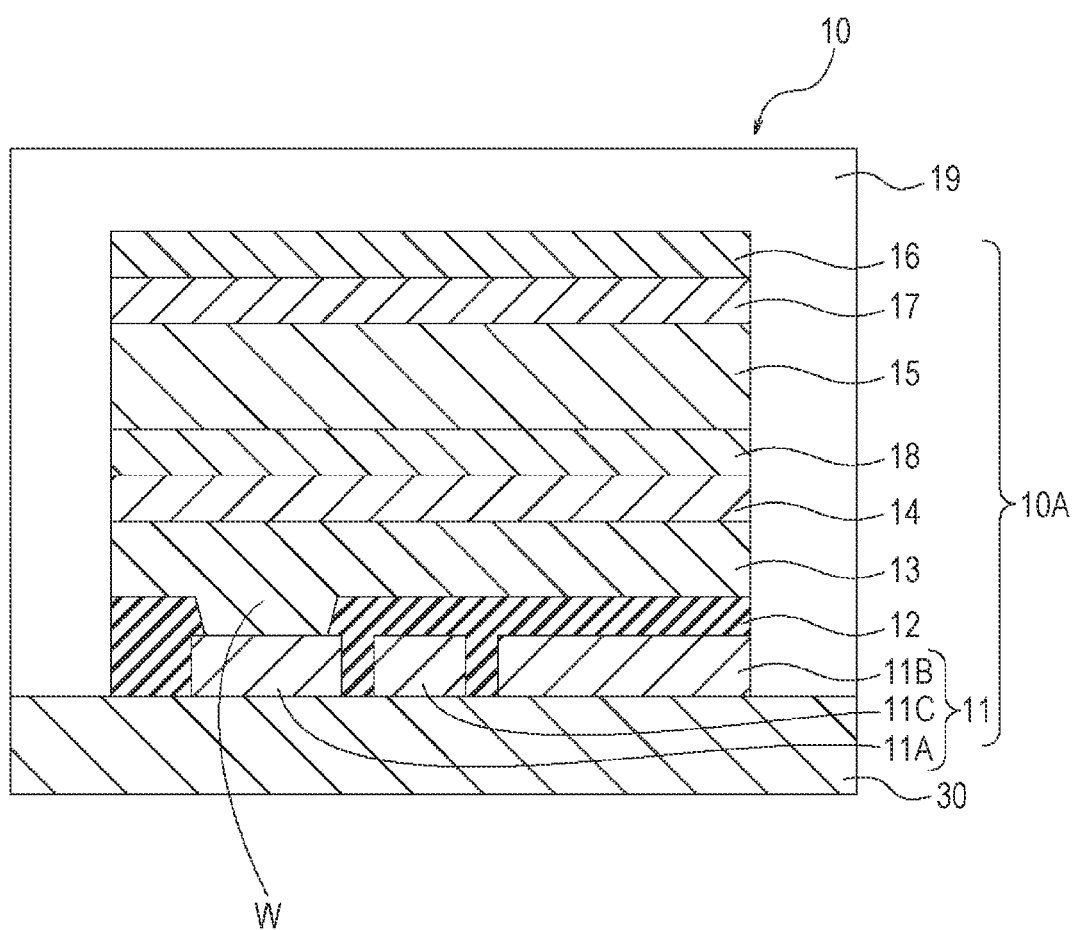
FIG. 1 is a cross-sectional view showing a configuration example of a solid-state imaging element to which the present technology is applied.

Hereinbelow, preferred forms for implementing the present technology are described. The embodiments described below show only examples of typical embodiments of the present technology, and the scope of the present technology should not be construed as being limited by them. Note that, unless otherwise specified, in a drawing, "upper" means the upward direction or the upper side in the drawing, "lower" means the downward direction or the lower side in the drawing, "left" means the left direction or the left side in the drawing, and "right" means the right direction or the right side in the drawing. Further, in the drawings, identical or equivalent elements or members are marked with the same reference sign, and a repeated description is omitted.

Note that the description is given in the following order.
1. Outline of present technology
2. First embodiment (example 1 of solid-state imaging element)
3. Second embodiment (example 2 of solid-state imaging element)
4. Third embodiment (example 3 of solid-state imaging element)
5. Fourth embodiment (example of electronic device)
6. Use examples of solid-state imaging elements to which present technology is applied
7. Application example to endoscopic surgery system
8. Application example to mobile bodies 1. Outline of Present Technology First, an outline of the present technology is described.

To obtain high-grade TFT characteristics and high reliability with, for example, an IGZO film, hydrogen termination by annealing in a water vapor atmosphere after film formation is necessary. This is because a reduction in trap density can be achieved by hydrogen termination. Meanwhile, a single IGZO film with a high film density has a low hydrogen diffusion rate. Thus, a film with a low film density that is easily hydrogen-terminated is preferable to create a high-grade state up to a channel section of a bottom portion of the film.

On the other hand, if an IGZO film with a low film density is employed, the vicinity of a surface (for example, the interface between the IGZO film and a photoelectric conversion layer (an n-type buffer layer), the same applies hereinafter) is likely to experience OH adsorption and water ($H_2O$) elimination, and undergoes carrier formation.

An oxide semiconductor, for example, is used for a charge accumulation layer (an oxide semiconductor layer); however, the surface of the charge accumulation layer (the oxide semiconductor layer) is unstable, and therefore there is a case where oxygen deficiency is likely to occur at the interface between a photoelectric conversion layer (a photoelectric conversion film) and the charge accumulation layer (the oxide semiconductor layer).

From the above, a second oxide semiconductor layer of a lower layer is set to be a low film density layer with good hydrogen diffusibility, and a first oxide semiconductor layer of an upper layer is set to be a high film density layer that suppresses OH adsorption and the elimination of water ($H_2O$); thereby, carrier generation in the vicinity of a surface (for example, the interface between the IGZO film and a photoelectric conversion layer (an n-type buffer layer)) can be suppressed. Further, hydrogen elimination in the vicinity of the surface can be suppressed by setting the first oxide semiconductor layer to have a lower hydrogen concentration than the second oxide semiconductor layer.

That is, a solid-state imaging element according to the present technology is a solid-state imaging element in which a first oxide semiconductor layer included in the solid-state imaging element according to the present technology has a higher film density, has a lower hydrogen concentration, or has a higher film density and has a lower hydrogen concentration than a second oxide semiconductor layer included in the solid-state imaging element according to the present technology in order to suppress OH adsorption and $H_2O$ elimination of surfaces of the first and second oxide semiconductor layers, for example surfaces of IGZO.

Hereinbelow, a solid-state imaging element of an embodiment according to the present technology is described in detail.

2. First Embodiment (Example 1 of Solid-State Imaging Element)

A solid-state imaging element of a first embodiment according to the present technology (example 1 of the solid-state imaging element) is a solid-state imaging element that includes at least a first photoelectric conversion section and a semiconductor substrate in which a second photoelectric conversion section is formed, in this order from the light incidence side, in which the first photoelectric conversion section includes at least a first electrode, a photoelectric conversion layer, a first oxide semiconductor layer, a second oxide semiconductor layer, and a second electrode in this order and the film density of the first oxide semiconductor layer is higher than the film density of the second oxide semiconductor layer.

The reliability of a solid-state imaging element can be improved by the solid-state imaging element of the first embodiment according to the present technology. In more detail, by the introduction of the first oxide semiconductor layer, which is a high density layer, the elimination of water ($H_2O$) sent from an oxide semiconductor of the second oxide semiconductor layer is suppressed, and an increase in carrier concentration of a surface of the first oxide semiconductor layer in contact with the photoelectric conversion layer (or an n-type buffer layer described later) can be suppressed.

The value of the film density of the first oxide semiconductor layer may be any value, but is preferably 6.11 to 6.35 g/cm$^3$, and the value of the film density of the second oxide semiconductor layer may be any value, but is preferably 5.80 to 6.10 g/cm$^3$.

In the solid-state imaging element of the first embodiment according to the present technology, the hydrogen concentration of the first oxide semiconductor layer is preferably lower than the hydrogen concentration of the second oxide semiconductor layer. The hydrogen concentration of the first oxide semiconductor layer may be any concentration, but is preferably 1.0E18 to 9.0E19 atoms/cm$^2$, and the hydrogen concentration of the second oxide semiconductor layer may be any concentration, but is preferably 1.0E20 to 5.0E21 atoms/cm$^2$.

FIG. 1 shows a solid-state imaging element 10 that is an example of the solid-state imaging element of the first embodiment according to the present technology. FIG. 1 is a cross-sectional view of the solid-state imaging element 10. The solid-state imaging element 10 is included in, for example, one pixel (a unit pixel P) in an imaging device such as a CMOS image sensor (an imaging device 1001, see FIG. 8).

The solid-state imaging element 10 includes a semiconductor substrate 30 in which a second photoelectric conversion section (not illustrated) is formed and a first photoelectric conversion section 10A. The solid-state imaging element 10 includes a photoelectric conversion layer 15 between a lower electrode 11 (a second electrode) and an upper electrode (a first electrode) 16 that are arranged facing each other. A first oxide semiconductor layer 14 and a second oxide semiconductor layer 13 are provided between the lower electrode (second electrode) 11 and the photoelectric conversion layer 15 via an insulating layer 12, in this order from the side of the photoelectric conversion layer 15 (the upper side of FIG. 1). The lower electrode 11 includes, as a plurality of mutually independent electrodes, a readout electrode 11A, an accumulation electrode 11B, and a transfer electrode 11C that is placed between, for example, the readout electrode 11A and the accumulation electrode 11B, the accumulation electrode 11B and the transfer electrode 11C are covered by the insulating layer 12, and the readout electrode 11A is electrically connected to the second oxide semiconductor layer 13 via an opening W provided in the insulating layer 12.

Note that, in the solid-state imaging element 10, an n-type buffer layer 18 is provided between the first oxide semiconductor layer 14 and the photoelectric conversion layer 15, and a p-type buffer layer 17 is provided between the upper electrode (first electrode) 16 and the photoelectric conversion layer 15. Further, in the solid-state imaging element 10, a sealing film 19 is formed so as to cover the first photoelectric conversion section 10A.

Each of the first oxide semiconductor layer 14 and the second oxide semiconductor layer 13 contains an oxide semiconductor material. Examples of the oxide semiconductor material include IGZO (an In—Ga—Zn—O-based oxide semiconductor), ZTO (a Zn—Sn—O-based oxide semiconductor), IGZTO (an In—Ga—Zn—Sn—O-based oxide semiconductor), GTO (a Ga—Sn—O-based oxide semiconductor), and IGO (an In—Ga—O-based oxide semiconductor). Each of the first oxide semiconductor layer 14 and the second oxide semiconductor layer 13 preferably uses at least one of the oxide semiconductor materials mentioned above, and preferably uses, among them, IGZO.

The total thickness of the first oxide semiconductor layer 14 and the second oxide semiconductor layer 13 is, for example, not less than 30 nm and not more than 200 nm, and preferably not less than 50 nm and not more than 150 nm.

Each of the first oxide semiconductor layer 14 and the second oxide semiconductor layer 13 is a layer for accumulating a signal charge generated in the photoelectric conversion layer 15 and transferring the signal charge to the readout electrode 11A. Each of the first oxide semiconductor layer 14 and the second oxide semiconductor layer 13 preferably uses a material that has a higher mobility of charge than the photoelectric conversion layer 15 and yet has a large band gap. Thereby, for example, the speed of charge transfer can be improved, and the injection of holes from the readout electrode 11A to the first oxide semiconductor layer 14 and the second oxide semiconductor layer 13 is suppressed.

The photoelectric conversion layer 15 is a layer that converts light energy to electrical energy, and is, for example, a layer that provides a field where an exciton generated when the layer absorbs light in the wavelength range of not less than 400 nm and not more than 2500 nm separates into an electron and a hole. The thickness of the photoelectric conversion layer 15 is, for example, not less than 100 nm and not more than 1000 nm, and preferably not less than 300 nm and not more than 800 nm.

Examples of materials to be contained in the photoelectric conversion layer 15 include organic-based materials and inorganic-based materials.

In a case where the photoelectric conversion layer 15 contains an organic-based material, the photoelectric conversion layer may have configurations like below ((1) to (4)).

Any of the following four types may be employed.
(1) Containing a p-type organic semiconductor.
(2) Containing an n-type organic semiconductor.
(3) Including a stacked structure of a p-type organic semiconductor layer and an n-type organic semiconductor layer. Including a stacked structure of a p-type organic semiconductor layer, a mixed layer (a bulk heterostructure) of a p-type organic semiconductor and an n-type organic semiconductor, and an n-type organic semiconductor layer. Including a stacked structure of a p-type organic semiconductor layer and a mixed layer (a bulk heterostructure) of a p-type organic semiconductor and an n-type organic semiconductor. Including a stacked structure of an n-type organic semiconductor layer and a mixed layer (a bulk heterostructure) of a p-type organic semiconductor and an n-type organic semiconductor.
(4) Including a mixture (a bulk heterostructure) of a p-type organic semiconductor and an n-type organic semiconductor.
(4) Including a mixture (a bulk heterostructure) of a p-type organic semiconductor and an n-type organic semiconductor. However, the stacking order may be arbitrarily changed.

As the p-type organic semiconductor, naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, a metal complex having a heterocyclic compound as a ligand, polythiophene derivatives, polybenzothiadiazole derivatives, polyfluorene derivatives, and the like may be given.

As the n-type organic semiconductor, fullerenes and fullerene derivatives (for example, fullerenes such as C60, C70, and C74 (higher fullerenes), endohedral fullerenes and the like, and fullerene derivatives (for example, fullerene fluorides, PCBM fullerene compounds, fullerene polymers, and the like)), an organic semiconductor having a larger (deeper) HOMO and a larger (deeper) LUMO than the p-type organic semiconductor, and transparent inorganic metal oxides may be given. As the n-type organic semiconductor, specifically, an organic molecule, an organic metal complex, or a subphthalocyanine derivative having, in part of the molecular framework, a heterocyclic compound containing a nitrogen atom, an oxygen atom, or a sulfur atom, such as a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylene vinylene derivative, a polybenzothiadiazole derivative, or a polyfluorene derivative, may be given. Examples of groups or the like included in the fullerene derivative include a halogen atom; a straight-chain, branched, or cyclic alkyl group or a phenyl group; a group having a straight-chain or annelated aromatic compound; a group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an aryl sulfide group; an alkyl sulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group having a chalcogenide; a phosphine group; and a phosphono group; and derivatives of these. The thickness of the photoelectric conversion layer containing an organic-based material (occasionally called as an "organic photoelectric conversion layer") is not limited, but is, for example, $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m, and still more preferably $1\times10^{-7}$ m to $1.8\times10^{-7}$ m.

Note that, although organic semiconductors are often classified into the p-type and the n-type, the p-type means that it is easy to transport holes and the n-type means that it is easy to transport electrons, and the p-type and the n-type are not limited to the interpretation of having holes or electrons as the majority carrier of thermal excitation like in inorganic semiconductors.

Alternatively, as materials to be contained in an organic photoelectric conversion layer that photoelectrically converts light of the wavelength of green, for example, rhodamine-based dyes, merocyanine-based dyes, quinacridone derivatives, subphthalocyanine-based dyes (subphthalocyanine derivatives), and the like may be given; as materials to be contained in an organic photoelectric conversion layer that photoelectrically converts blue light, for example, coumarinic acid dyes, tris(8-hydroxyquinolinato)aluminum (Alq3), merocyanine-based dyes, and the like may be given; and as materials to be contained in an organic photoelectric conversion layer that photoelectrically converts red light, for example, phthalocyanine-based dyes and subphthalocyanine-based dyes (subphthalocyanine derivatives) may be given.

Alternatively, as inorganic-based materials to be contained in the photoelectric conversion layer, crystalline silicon, amorphous silicon, microcrystalline silicon, crystalline selenium, amorphous selenium, CuInGaSe (GIGS), CuInSe$_2$ (CIS), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, which are chalcopyrite-based compounds, GaAs, InP, AlGaAs, InGaP, AlGaInP, and InGaAsP, which are group III-V compounds, and compound semiconductors such as CdSe, CdS, In$_2$Se$_3$, In$_2$S$_3$, Bi$_2$Se$_3$, Bi$_2$S$_3$, ZnSe, ZnS, PbSe, and PbS may be given. In addition, quantum dots containing these materials may be used for the photoelectric conversion layer.

The second electrode 11 (11A to 11C) is preferably a transparent electrode containing a transparent electrically conductive material. The second electrodes 11A to 11C may contain the same material, or may contain different materials. Each of the second electrodes 11A to 11C can be formed by the sputtering method or the chemical vapor deposition method (CVD).

Examples of the transparent electrically conductive material include indium oxide, an indium-tin oxide (ITO, indium tin oxide, including Sn-doped In$_2$O$_3$, crystalline ITO, and amorphous ITO), an indium-zinc oxide (IZO, indium zinc oxide) in which indium is added as a dopant to zinc oxide, an indium-gallium oxide (IGO) in which indium is added as a dopant to gallium oxide, an indium-gallium-zinc oxide (IGZO, In—GaZnO$_4$) in which indium and gallium are added as dopants to zinc oxide, an indium-tin-zinc oxide (ITZO) in which indium and tin are added as dopants to zinc oxide, IFO (F-doped In$_2$O$_3$), tin oxide (SnO$_2$), ATO (Sb-doped SnO$_2$), FTO (F-doped SnO$_2$), zinc oxide (including ZnO doped with other elements), an aluminum-zinc oxide (AZO) in which aluminum is added as a dopant to zinc oxide, a gallium-zinc oxide (GZO) in which gallium is added as a dopant to zinc oxide, titanium oxide (TiO$_2$), a niobium-titanium oxide (TNO) in which niobium is added as a dopant to titanium oxide, antimony oxide, a spinel-type oxide, and an oxide having a YbFe$_2$O$_4$ structure.

The first electrode 16 includes, for example, a transparent electrically conductive film such as an indium tin oxide film or an indium zinc oxide film, or the like.

As the material of the insulating layer 12, inorganic-based insulating materials such as silicon oxide-based materials, silicon nitride (SiN$_x$), and metal oxide high-dielectric insulating materials such as aluminum oxide (Al$_2$O$_3$) are given. In addition, organic-based insulating materials (organic polymers), examples including polymethyl methacrylate (PMMA), polyvinylphenol (PVP), polyvinyl alcohol (PVA), polyimides, polycarbonates (PC), polyethylene terephthalate (PET), polystyrene, silanol derivatives (silane coupling agents) such as N-2-(aminoethyl)-3-aminopropyltrimethoxysilane (AEAPTMS), 3-mercaptopropyltrimethoxysilane (MPTMS), and octadecyltrichlorosilane (OTS), novolak-type phenolic resins, fluorine-based resins, and a straight-chain hydrocarbon having, at one end, a functional group capable of binding to a control electrode, such as octadecanethiol and dodecyl isocyanate, may be given, and these may be used in combination. Note that, as silicon oxide-based materials, silicon oxide (SiO$_x$), BPSG, PSG, BSG, AsSG, PbSG, silicon oxynitride (SiON), SOG (spin-on glass), and low-permittivity materials (for example, polyaryl ethers, cycloperfluorocarbon polymers, benzocyclobutene, cyclic fluororesins, polytetrafluoroethylene, fluorinated aryl ethers, fluorinated polyimides, amorphous carbon, and organic SOG) are given.

Figure 2:
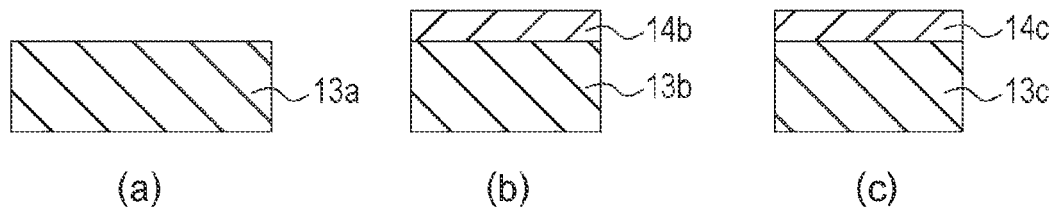
FIG. 2 is cross-sectional views schematically showing configuration examples of a first oxide semiconductor layer and a second oxide semiconductor layer included in a solid-state imaging element to which the present technology is applied.

The insulating layer 12 is a layer for electrically separating the accumulation electrode 11B and the transfer electrode 11C and the second oxide semiconductor layer 13. The insulating layer 12 is provided so as to cover the lower electrode 11. Further, in the insulating layer 12, an opening is provided on the readout electrode 11A of the lower electrode 11, and the readout electrode 11A and the charge accumulation layer 13 are electrically connected via the opening. The side surface of the opening 12H preferably has, for example, an inclination expanding toward the light incidence side S1, as shown in FIG. 2. Thereby, the movement of charge from the charge accumulation layer 13 to the readout electrode (third electrode) 11A is smoothed.

The p-type buffer layer 17 is a layer for promoting the supply of holes generated by the photoelectric conversion layer 15 to the first electrode 16, and may contain, for example, molybdenum oxide (MoO$_3$), nickel oxide (NiO), vanadium oxide (V$_2$O$_5$), or the like. The p-type buffer layer (hole transportation layer) may contain an organic material such as poly(3,4-ethylenedioxythiophene) (PEDOT), N,N'-bis(3-methylphenyl)-N,N'-diphenylbenzidine (TPD), or 4,4',4''-tris[2-naphthyl(phenyl)amino]triphenylamine (2T-NATA).

The n-type buffer layer 18 is a layer for promoting the supply of electrons generated by the photoelectric conversion layer 15 to the second electrode 11A, and may contain, for example, titanium oxide (TiO$_2$), zinc oxide (ZnO), or the like. The n-type buffer layer 18 may be formed also by stacking titanium oxide and zinc oxide. Further, the n-type buffer layer 18 may contain a high-molecular semiconductor material or an organic-based material such as a material that is an organic molecule or an organic metal complex including a heterocycle including N as part of the molecular framework, such as pyridine, quinoline, acridine, indole, imidazole, benzimidazole, or phenanthroline, and that has limited absorption in the visible light region.

The readout electrode 11A is an electrode for transferring a signal charge generated in the photoelectric conversion layer 15 to a floating diffusion section (not illustrated).

The accumulation electrode 11B is an electrode for accumulating, in the first oxide semiconductor layer 14 and the second oxide semiconductor layer 13, a signal charge (electrons) out of the charges generated in the photoelectric conversion layer 15. The accumulation electrode 11B is preferably larger than the readout electrode 11A, and can thereby accumulate a large amount of charge.

The transfer electrode 11C is an electrode for improving the efficiency of transfer of charge accumulated in the accumulation electrode 11B to the readout electrode 11A, and is provided between the readout electrode 11A and the accumulation electrode 11B. The transfer electrode 11C is, for example, connected to a pixel driving circuit included in a driving circuit. The readout electrode 11A, the accumulation electrode 11B, and the transfer electrode 11C can apply voltage independently of each other.

The solid-state imaging element of the first embodiment according to the present technology can be manufactured by using a known method, for example, the sputtering method, a method of performing patterning by photolithography technology and performing dry etching or wet etching, or a wet film formation method. Examples of the wet film formation method include the spin coating method, the immersion method, the casting method, various printing methods such as the screen printing method, the inkjet printing method, the offset printing method, and the gravure printing method, the stamping method, the spraying method, and various coating methods such as the air doctor coater method, the blade coater method, the rod coater method, the knife coater method, the squeeze coater method, the reverse roll coater method, the transfer roll coater method, the gravure coater method, the kiss coater method, the cast coater method, the spray coater method, the slit orifice coater method, and the calender coater method.

Figure 7:
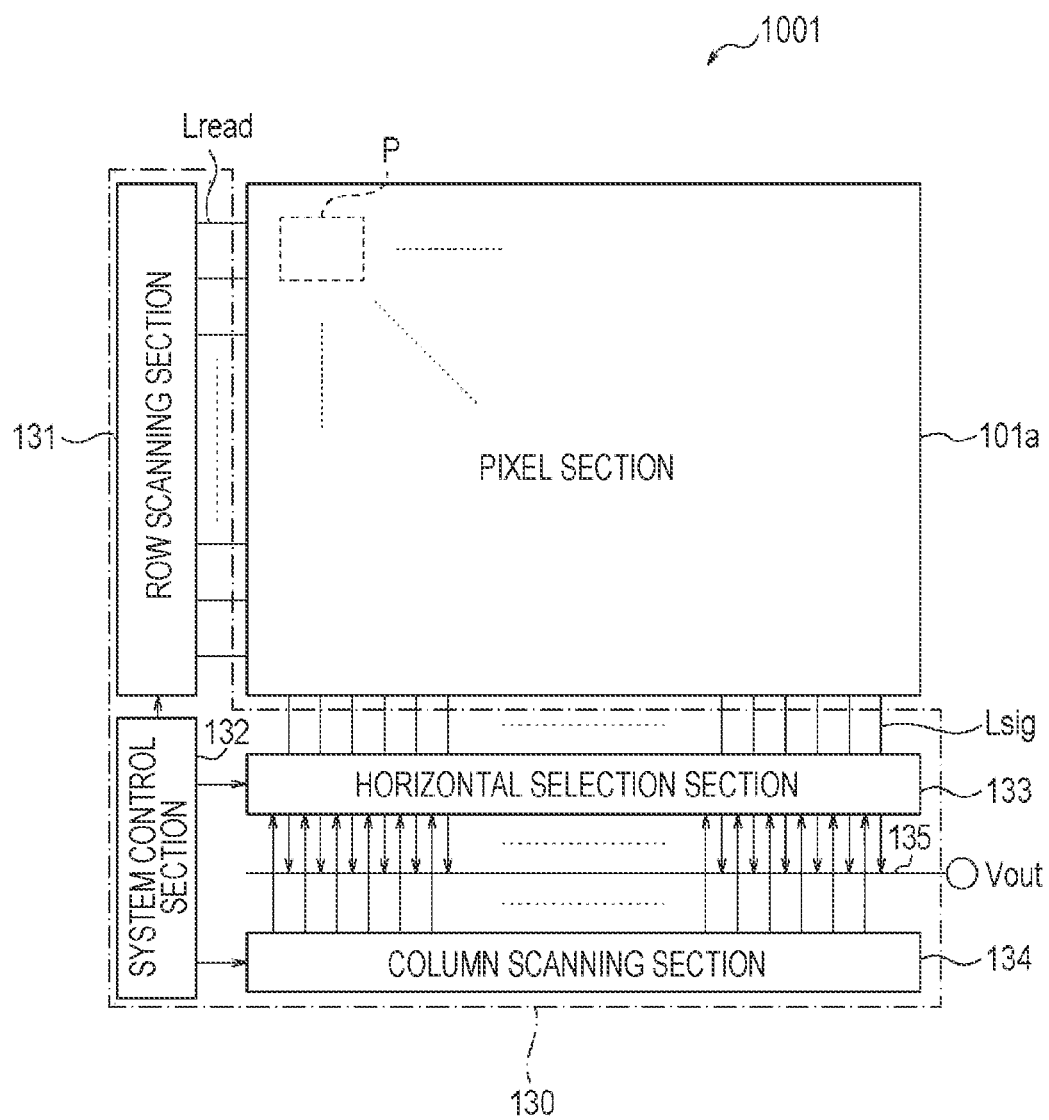
FIG. 7 is a block diagram showing an overall configuration of a solid-state imaging element to which the present technology is applied.

FIG. 7 is a functional block diagram showing a solid-state imaging element 1001. The solid-state imaging element 1001 is a CMOS image sensor and has a pixel section 101a as an imaging area, and has, for example, a circuit section 130 including a row scanning section 131, a horizontal selection section 133, a column scanning section 134, and a system control section 132. Provided in a region around the pixel section 1a or stacked with the pixel section 101a, the circuit section 130 may be provided in a region around the pixel section 101a, or may be provided to be stacked with the pixel section 101a (in a region facing the pixel section 101a).

The pixel section 101a has, for example, a plurality of unit pixels P (each of which corresponds to, for example, the solid-state imaging element 10 (serving as one pixel)) that are two-dimensionally arranged in a matrix form. In the unit pixel P, for example, a pixel driving line Lread (specifically, a row selection line and a reset control line) is drawn for each pixel row, and a vertical signal line Lsig is drawn for each pixel column. The pixel driving line Lread is a line that transmits a driving signal for reading out a signal sent from the pixel. One end of the pixel driving line Lread is connected to an output end corresponding to a row of the row scanning section 131.

The row scanning section 131 is a pixel driving unit that includes a shift register, an address decoder, etc. and that drives each pixel P of the pixel section 101a, for example on a row basis. Signals outputted from the pixels P of the pixel rows selectively scanned by the row scanning section 131 are supplied to the horizontal selection section 133 through the respective vertical signal lines Lsig. The horizontal selection section 133 includes amplifiers, horizontal selection switches, etc. provided individually for the vertical signal lines Lsig.

The column scanning section 134 is a section that includes a shift register, an address decoder, etc. and that sequentially scans and drives the horizontal selection switches of the horizontal selection section 133. By the selective scanning by the column scanning section 134, signals of the pixels transmitted through the vertical signal lines Lsig are sequentially transmitted to a horizontal signal line 135, and are outputted to the outside through the horizontal signal line 135.

The system control section 132 is a section that receives clocks given from the outside, data for issuing commands of operating modes, etc. and further outputs data of inside information of the solid-state imaging element 1001, etc. The system control section 132 further includes a timing generator that generates various timing signals, and performs the driving control of the row scanning section 131, the horizontal selection section 133, the column scanning section 134, etc., on the basis of various timing signals generated by the timing generator.

FIG. 2 is cross-sectional views schematically showing configuration examples of a first oxide semiconductor layer and a second oxide semiconductor layer included in a solid-state imaging element according to the present technology.

FIG. 2(a) shows a second oxide semiconductor layer 13a, FIG. 2(b) shows that a first oxide semiconductor layer 14b with a low hydrogen concentration is provided on a second oxide semiconductor layer 13b (which can be used for, for example, a solid-state imaging element of a second embodiment described later), and FIG. 2(c) shows that a first oxide semiconductor layer 14c with a high film density is provided on a second oxide semiconductor layer 13c (which can be used for, for example, the solid-state imaging element of the first embodiment). Each of the second oxide semiconductor layers 13a, 13b, and 13c is a film having few traps, and is in a state of being hydrogen-terminated by $H_2O$ annealing or the like; thus, each of the second oxide semiconductor layers 13a, 13b, and 13c is a film in which some amount of hydrogen is contained, and has such a film density as to be recovered by annealing. The first oxide semiconductor layer 14b is a film that suppresses the hydrogen elimination of the surface, and the first oxide semiconductor layer 14c is a dehydration suppression film.

Figure 3:
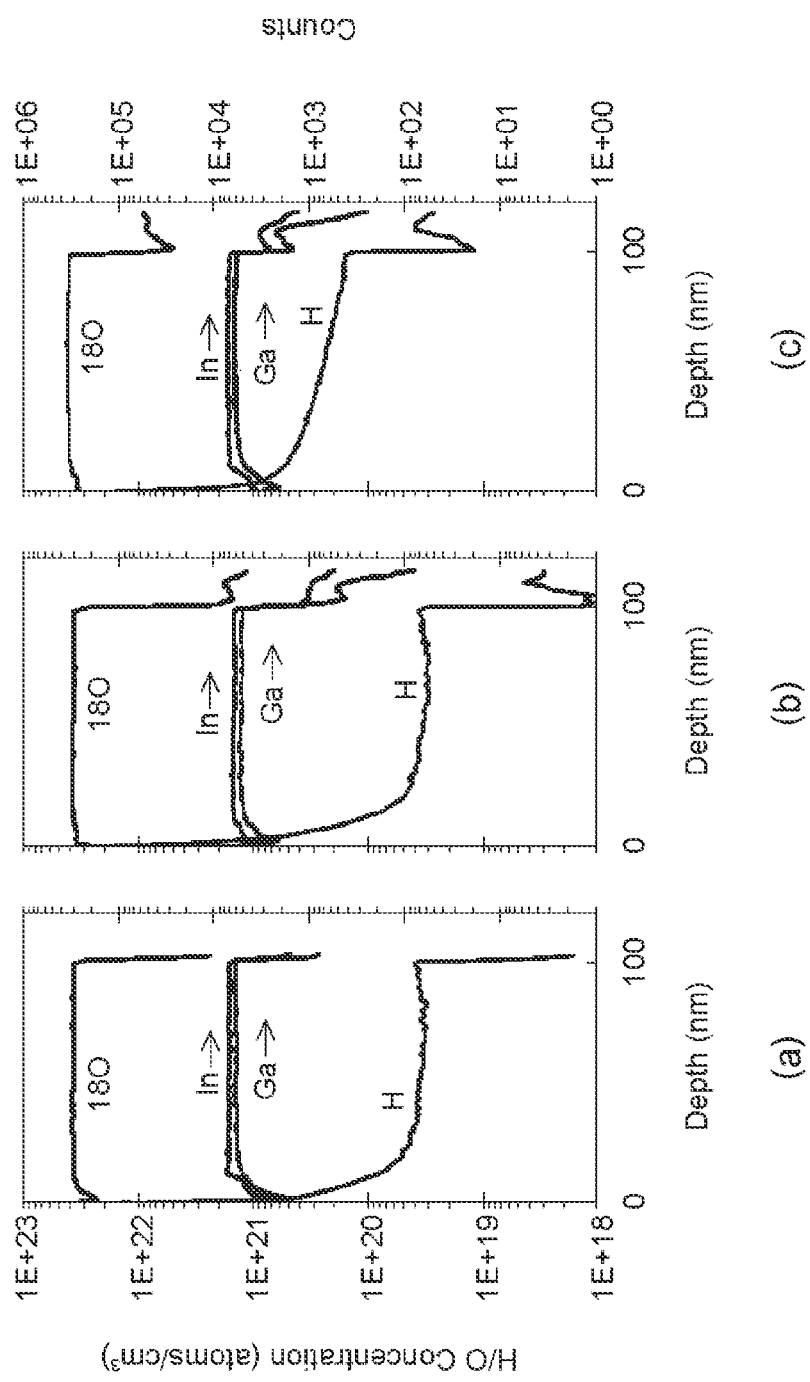
FIG. 3 is a diagram showing relationships between annealing in a water vapor atmosphere and the hydrogen concentration in the first oxide semiconductor layer.

FIG. 3 is a diagram showing relationships between annealing in a water vapor atmosphere and the hydrogen concentration in the first oxide semiconductor layer. The horizontal axis of FIG. 3 represents the depth (the length in the thickness direction) (Depth (nm)) of the first oxide semiconductor layer (or the second oxide semiconductor layer), the left side of the vertical axis of FIG. 3 represents the H/O concentration (atoms/cm$^3$), and the right side of the vertical axis of FIG. 3 represents the counts. Data of hydrogen (H) and oxygen (O) correspond to the left side (the H/O concentration (atoms/cm$^3$)) of the vertical axis of FIG. 3, and data of indium (In) and gallium (Ga) correspond to the right side (the counts) of the vertical axis of FIG. 3. The film thickness (depth) of the first oxide semiconductor layer (or the second oxide semiconductor layer) can be found by using data of indium (In), gallium (Ga), and oxygen (O).

FIG. 3(a) is a diagram showing a relationship with the hydrogen concentration in the first oxide semiconductor layer when annealing is not performed, FIG. 3(b) is a diagram showing a relationship between annealing (150° C., 2 hours) and the hydrogen concentration in the first oxide semiconductor layer, and FIG. 3(c) is a diagram showing a relationship between annealing (350° C., 2 hours) and the hydrogen concentration in the first oxide semiconductor layer. FIG. 3 shows an increase in hydrogen concentration in the first oxide semiconductor layer (in the film) depending on the annealing temperature in a water vapor atmosphere. With annealing of 150° C. (×2 hours), there is no change from immediately after film formation (annealing is not performed); however, at 350° C. (×2 hours), hydrogen concentrations of not less than the 20th power are obtained with a gradient from the surface side of the film to a depth of 100 nm. Note that FIG. 3 similarly applies to the second oxide semiconductor layer.

Figure 4:
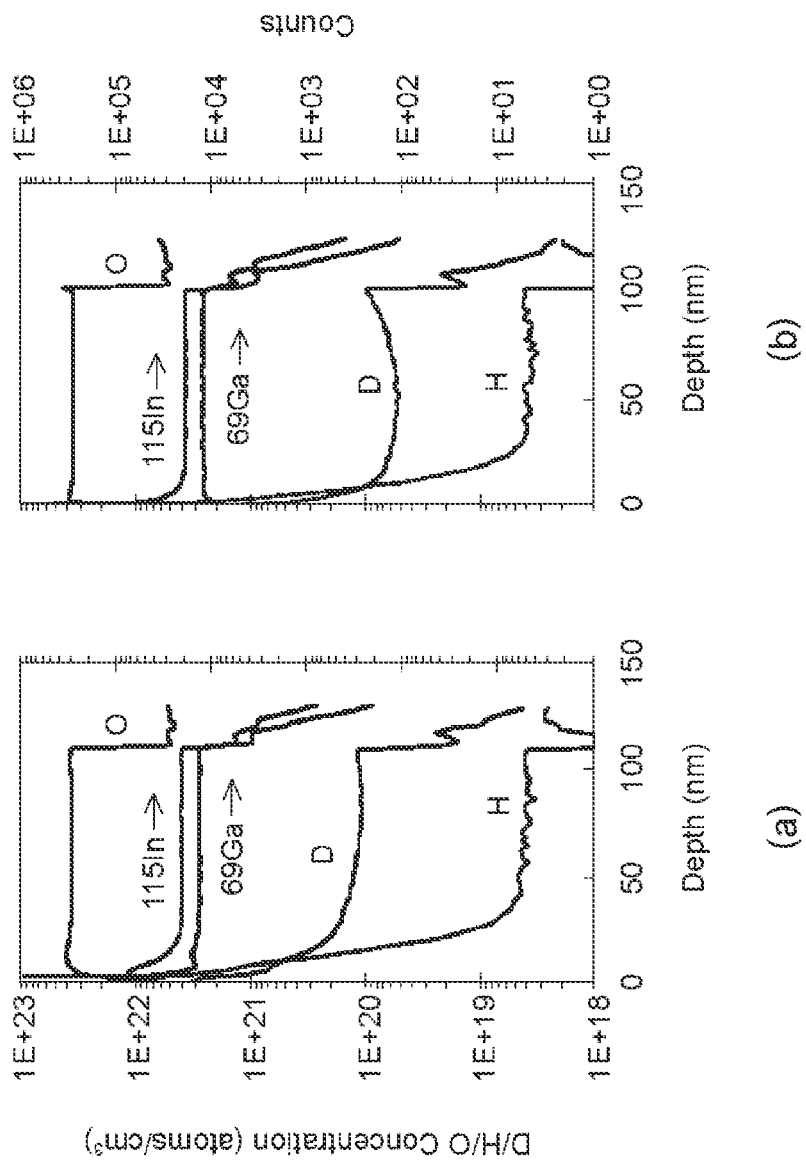
FIG. 4 is a diagram showing relationships between deuterium after heavy water annealing and the film density of the first oxide semiconductor layer.

FIG. 4 is a diagram showing relationships between deuterium after heavy water annealing and the film density of the first oxide semiconductor layer. The horizontal axis of FIG. 4 represents the depth (the length in the thickness direction) (Depth (nm)) of the first oxide semiconductor layer (or the second oxide semiconductor layer), the left side of the vertical axis of FIG. 4 represents the D/H/O concentration (atoms/cm$^3$), and the right side of the vertical axis of FIG. 4 represents the counts. Data of deuterium (D), hydrogen (H), and oxygen (O) correspond to the left side (the D/H/O concentration (atoms/cm$^3$)) of the vertical axis of FIG. 4, and data of indium (In) and gallium (Ga) correspond to the right side (the counts) of the vertical axis of FIG. 4. The film thickness (depth) of the first oxide semiconductor layer (or the second oxide semiconductor layer) can be found by using data of indium (In), gallium (Ga), and oxygen (O).

FIG. 4(a) is a diagram showing relationships between deuterium after heavy water annealing and the film density of the first oxide semiconductor layer (6.12 g/cm$^3$), and FIG. 4(b) is a diagram showing relationships between deuterium after heavy water annealing and the film density of the first oxide semiconductor layer (6.28 g/cm3). FIG. 4 shows a difference in hydrogen concentration in annealing in a water vapor atmosphere depending on the film density of the first oxide semiconductor layer (an IGZO film). In order to make a distinction with hydrogen originally existing in the film, annealing was performed in a deuterium water atmosphere. At a film density of 6.12 g/cm$^3$ (FIG. 4(a)), values not less than 1E20 atoms/cm$^3$ are obtained; however, at a film density of 6.28 g/cm$^3$ (FIG. 4(b)), the hydrogen concentration is not more than 1E20 atoms/cm$^3$. Note that FIG. 4 similarly applies to the second oxide semiconductor layer.

Figure 5:
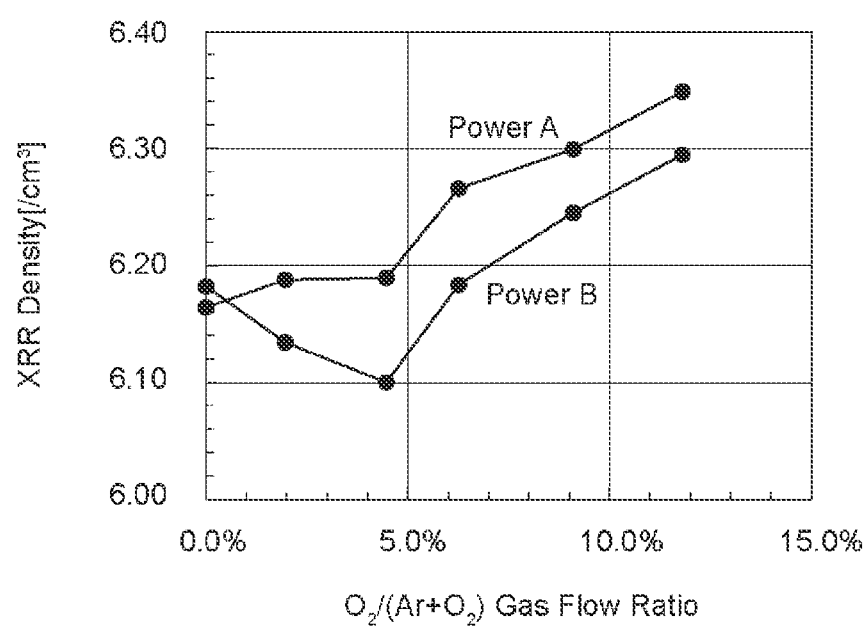
FIG. 5 is a diagram showing relationships between the flow rate of oxygen gas and the film density of the first oxide semiconductor layer.

FIG. 5 is a diagram showing relationships between the flow rate of oxygen gas and the film density of the first oxide semiconductor layer. The horizontal axis of FIG. 5 represents the O$^2$/(Ar+O$^2$) flow ratio, and the vertical axis of FIG. 5 represents the XRD density [/cm$^3$].

If the flow rate of oxygen gas is increased or decreased, the film density can be changed. The film density can be changed also by changing the input power (Power A and Power B shown in FIG. 5). Note that FIG. 5 similarly applies to the second oxide semiconductor layer.

Figure 6:
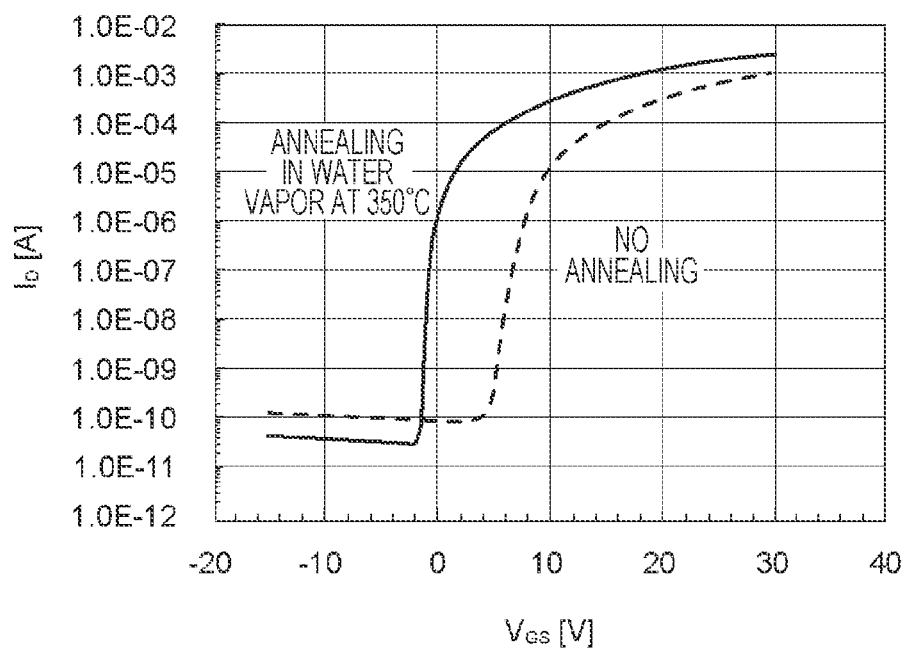
FIG. 6 is a diagram for describing TFT characteristics depending on times before and after annealing in a water vapor atmosphere.

FIG. 6 is a diagram for describing TFT characteristics depending on times before and after annealing in a water vapor atmosphere. The horizontal axis of FIG. 6 represents $V_{GS}$ [V] (the gate voltage), and the vertical axis of FIG. 6 represents $I_D$ [A] (the drain current).

Id-Vg characteristics of a TFT using an IGZO film (the first oxide semiconductor layer) before and after annealing in a water vapor atmosphere will now be shown. As shown in FIG. 6, by a reduction in the number of in-film traps by hydrogen introduction, the threshold voltage is made near 0 V, and a steep rise is exhibited. Note that FIG. 6 similarly applies to the second oxide semiconductor layer.

3. Second Embodiment (Example 2 of Solid-State Imaging Element)

A solid-state imaging element of a second embodiment according to the present technology (example 2 of the solid-state imaging element) is a solid-state imaging element that includes at least a first photoelectric conversion section and a semiconductor substrate in which a second photoelectric conversion section is formed, in this order from the light incidence side, in which the first photoelectric conversion section includes at least a first electrode, a photoelectric conversion layer, a first oxide semiconductor layer, a second oxide semiconductor layer, and a second electrode in this order and the hydrogen concentration of the first oxide semiconductor layer is lower than the hydrogen concentration of the second oxide semiconductor layer.

The reliability of a solid-state imaging element can be improved by the solid-state imaging element of the second embodiment according to the present technology. In more detail, an increase in carrier concentration due to H$_2$O elimination toward the side of the photoelectric conversion layer (an n-type buffer layer) is suppressed by the introduction of the first oxide semiconductor layer, which is a low hydrogen concentration layer. That is, in the first oxide semiconductor layer having a low hydrogen concentration, water (H$_2$O) is less likely to be eliminated, and the occurrence of oxygen deficiency of a surface (a surface in contact with the photoelectric conversion layer (or the n-type buffer layer)) can be suppressed.

In the solid-state imaging element of the second embodiment according to the present technology, the film density of the first oxide semiconductor layer is preferably higher than the film density of the second oxide semiconductor layer.

For the solid-state imaging element of the second embodiment according to the present technology, the matter described in the section of the solid-state imaging element of the first embodiment according to the present technology (including the matter regarding FIG. 1 to FIG. 7) can be applied as it is except for the above description.

4. Third Embodiment (Example 3 of Solid-State Imaging Element)

A solid-state imaging element of a third embodiment according to the present technology (example 3 of the solid-state imaging element) is a solid-state imaging element that includes at least a first photoelectric conversion section and a semiconductor substrate in which a second photoelectric conversion section is formed, in this order from the light incidence side, in which the first photoelectric conversion section includes at least a first electrode, a photoelectric conversion layer, a first oxide semiconductor layer, a second oxide semiconductor layer, and a second electrode in this order, the film density of the first oxide semiconductor layer is higher than the film density of the second oxide semiconductor layer, and the hydrogen concentration of the first oxide semiconductor layer is lower than the hydrogen concentration of the second oxide semiconductor layer.

In the solid-state imaging element of the third embodiment according to the present technology, by the introduction of the first oxide semiconductor layer, which is a high density layer and has a low hydrogen concentration, the elimination of H$_2$O from an oxide semiconductor of the second oxide semiconductor layer is suppressed, an increase in carrier concentration of a surface of the first oxide semiconductor layer in contact with the photoelectric conversion layer (or an n-buffer layer) can be suppressed, and furthermore an increase in carrier concentration due to H$_2$O elimination toward the side of the photoelectric conversion layer (the n-type buffer layer) is suppressed. That is, the first oxide semiconductor layer of the solid-state imaging element of the third embodiment according to the present technology is also a low hydrogen concentration layer; therefore, water (H$_2$O) is less likely to be eliminated, and the occurrence of oxygen deficiency of a surface (a surface in contact with the photoelectric conversion layer (or the n-buffer layer)) can be suppressed.

For the solid-state imaging element of the third embodiment according to the present technology, the matter described in the section of the solid-state imaging element of the first embodiment according to the present technology (including the matter regarding FIG. 1 to FIG. 7) can be applied as it is except for the above description.

5. Fourth Embodiment (Example of Electronic Device)

An electronic device of a fourth embodiment according to the present technology is an electronic device that includes any one solid-state imaging element of the solid-state imaging elements of the first to third embodiments according to the present technology. The solid-state imaging element of the first to third embodiments according to the present technology is as mentioned above, and therefore herein a description is omitted. The electronic device of the fourth embodiment according to the present technology includes a solid-state imaging element having excellent reliability, and can therefore improve the reliability of electronic devices, etc.

Figure 8:
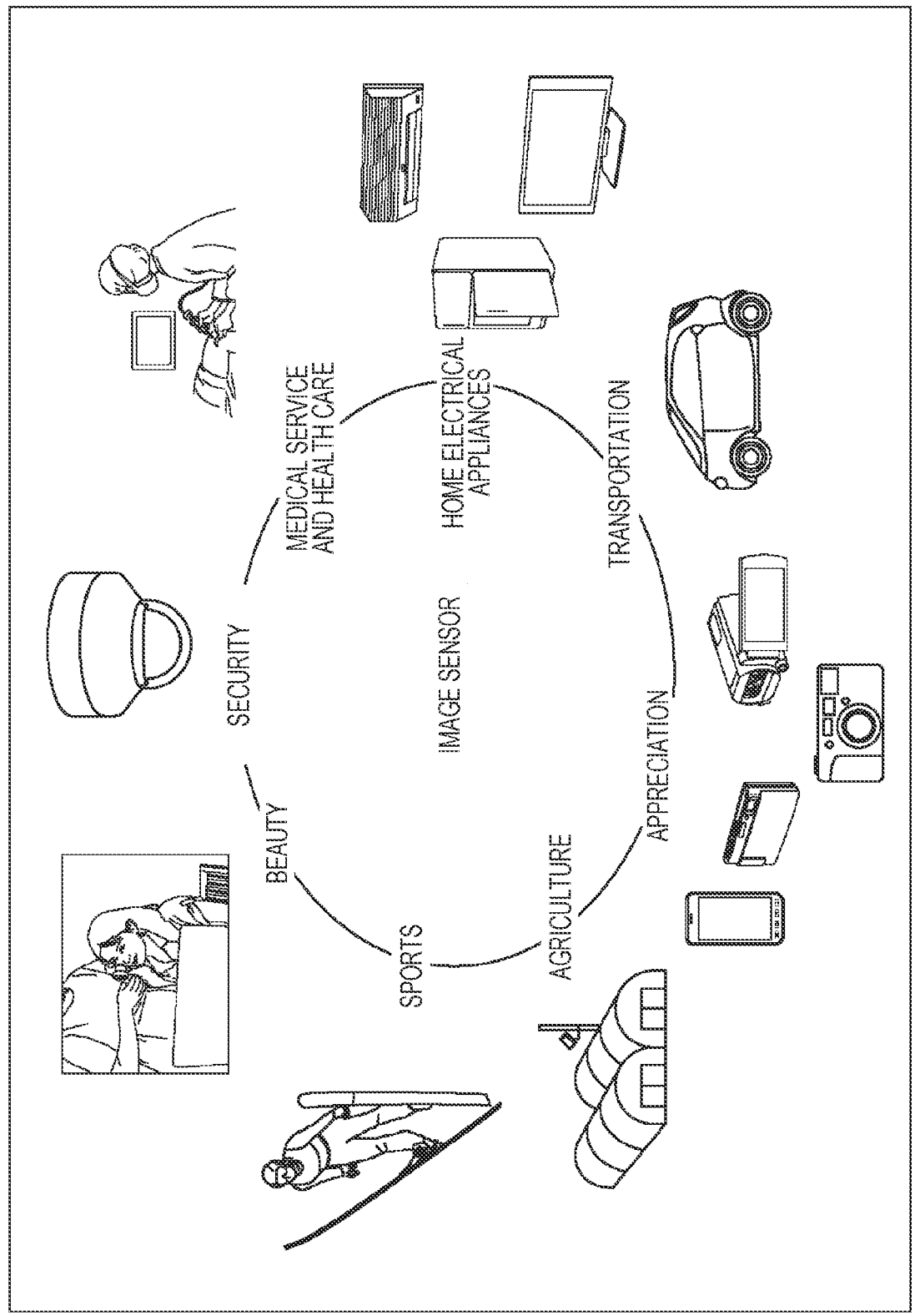
FIG. 8 is a diagram showing use examples of solid-state imaging elements to which the present technology is applied.

6. Use Examples of Solid-State Imaging Elements to which Present Technology is Applied FIG. 8 is a diagram showing use examples of the solid-state imaging element of the first to third embodiments according to the present technology, as an image sensor.

The solid-state imaging element of the first to third embodiments described above can be used for, for example, various cases where light such as visible light, infrared light, ultraviolet light, or X-rays is sensed, as shown below. That is, as shown in FIG. 8, the solid-state imaging element of the first to third embodiments can be used for an apparatus (for example, the electronic device of the fourth embodiment described above) used in the field of appreciation in which images used for appreciation are imaged, the field of transportation, the field of home electrical appliances, the field of medical service and health care, the field of security, the field of beauty culture, the field of sports, the field of agriculture, etc., for example.

Specifically, in the field of appreciation, for example, the solid-state imaging element of the first to third embodiments can be used for an apparatus for imaging images used for appreciation, such as a digital camera, a smartphone, or a mobile phone provided with a camera function.

In the field of transportation, for example, the solid-state imaging element of the first to third embodiments can be used for an apparatus used for transportation for safe driving such as automatic stopping, the recognition of the state of a driver, etc., such as a car-mounted sensor that images the front side, the rear side, the surroundings, the inside, etc. of an automobile, a surveillance camera that monitors moving vehicles and a road, or a distance measuring sensor that performs distance measuring of the distance between vehicles or the like.

In the field of home electrical appliances, for example, the solid-state imaging element of the first to third embodiments can be used for an apparatus used for home electrical appliances in order to image a gesture of a user and perform device operation in accordance with the gesture, such as a television, a refrigerator, or an air conditioner.

In the field of medical service and health care, for example, the solid-state imaging element of the first to third embodiments can be used for an apparatus used for medical service and health care, such as an endoscope or an apparatus that performs blood vessel imaging by receiving infrared light.

In the field of security, for example, the solid-state imaging element of the first to third embodiments can be used for an apparatus used for security, such as a surveillance camera for crime prevention use or a camera for person authentication use.

In the field of beauty culture, for example, the solid-state imaging element of the first to third embodiments can be used for an apparatus used for beauty culture, such as a skin measuring device that images a skin or a microscope that images the scalp.

In the field of sports, for example, the solid-state imaging element of the first to third embodiments can be used for an apparatus used for sports, such as an action camera or a wearable camera for sports use or the like.

In the field of agriculture, for example, the solid-state imaging element of the first to third embodiments can be used for an apparatus used for agriculture, such as a camera for monitoring the state of a farm and crops.

Figure 9:
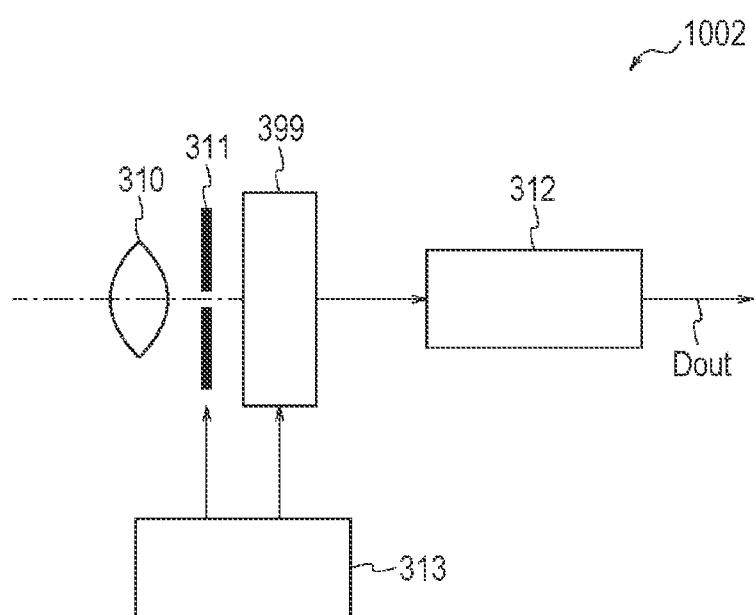
FIG. 9 is a functional block diagram of an example of an electronic device to which the present technology is applied.

Next, use examples of the solid-state imaging element of the first to third embodiments according to the present technology are specifically described. For example, the solid-state imaging element 1001 described above can be used for all types of electronic apparatuses including an imaging function, such as camera systems such as digital still cameras and video cameras, and mobile phones having an imaging function. FIG. 9 shows, as an example, a rough configuration of an electronic apparatus 1002 (a camera). The electronic apparatus 1002 is, for example, a video camera capable of capturing still images or moving images, and includes a solid-state imaging element 399, an optical system (optical lens) 310, a shutter device 311, a driving unit 313 that drives the solid-state imaging element 399 and the shutter device 311, and a signal processing section 312.

The optical system 310 is a system that guides image light (incidence light) sent from a subject to a pixel section of the solid-state imaging element 399. The optical system 310 may include a plurality of optical lenses. The shutter device 311 is a device that controls the period of light irradiation and the period of light blocking for the solid-state imaging element 399. The driving unit 313 is a section that controls a transfer operation of the solid-state imaging element 399 and a shutter operation of the shutter device 311. The signal processing section 312 is a section that performs various pieces of signal processing on a signal outputted from the solid-state imaging element 399. A video image signal Dout after signal processing is stored in a storage medium such as a memory, or is outputted to a monitor or the like.

7. Application Example to Endoscopic Surgery System

The present technology can be applied to various products. For example, the technology according to the present disclosure (present technology) can be applied to the endoscopic surgery system.

Figure 10:
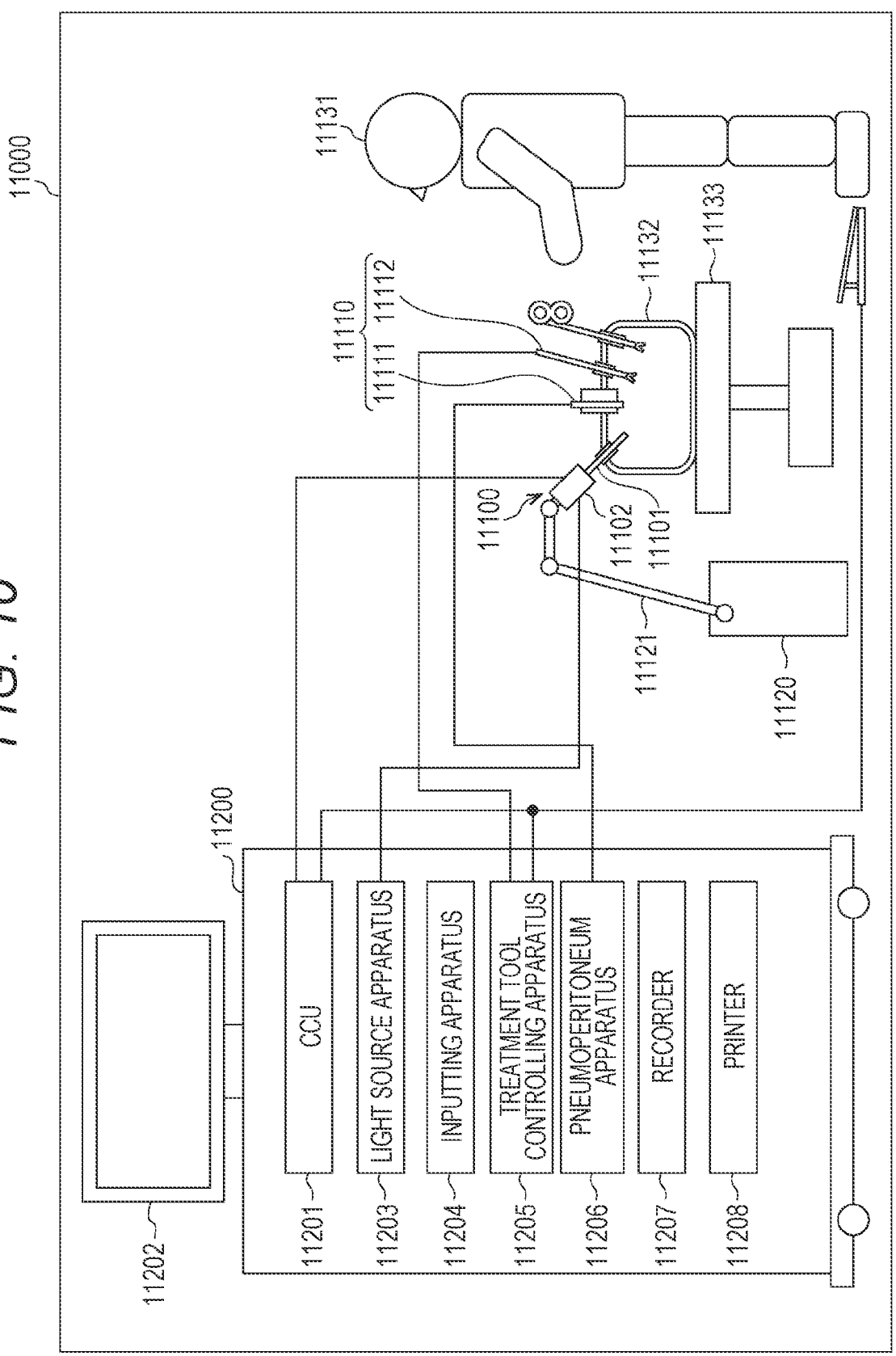
FIG. 10 is a view showing an example of a schematic configuration of an endoscopic surgery system.

FIG. 10 is a view showing an example of a schematic configuration of an endoscopic surgery system to which the technology according to an embodiment of the present disclosure (present technology) can be applied.

In FIG. 10, a state is illustrated in which a surgeon (medical doctor) 11131 is using an endoscopic surgery system 11000 to perform surgery for a patient 11132 on a patient bed 11133. As illustrated, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example illustrated, the endoscope 11100 is illustrated which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an imaging element are provided in the inside of the camera head 11102 such that reflected light (observation light) from the observation target is condensed on the imaging element by the optical system. The observation light is photo-electrically converted by the imaging element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image capturing condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a captured image can be performed by the light source apparatus 11203. Further, in this case, if laser beams from the respective RGB laser light sources are irradiated time-divisionally on an observation target and driving of the imaging elements of the camera head 11102 are controlled in synchronism with the irradiation timings. Then images individually corresponding to the R, G and B colors can be also captured time-divisionally. According to this method, a color image can be obtained even if color filters are not provided for the imaging element.

Further, the light source apparatus 11203 may be controlled such that the intensity of light to be outputted is changed for each predetermined time. By controlling driving of the imaging element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 11:
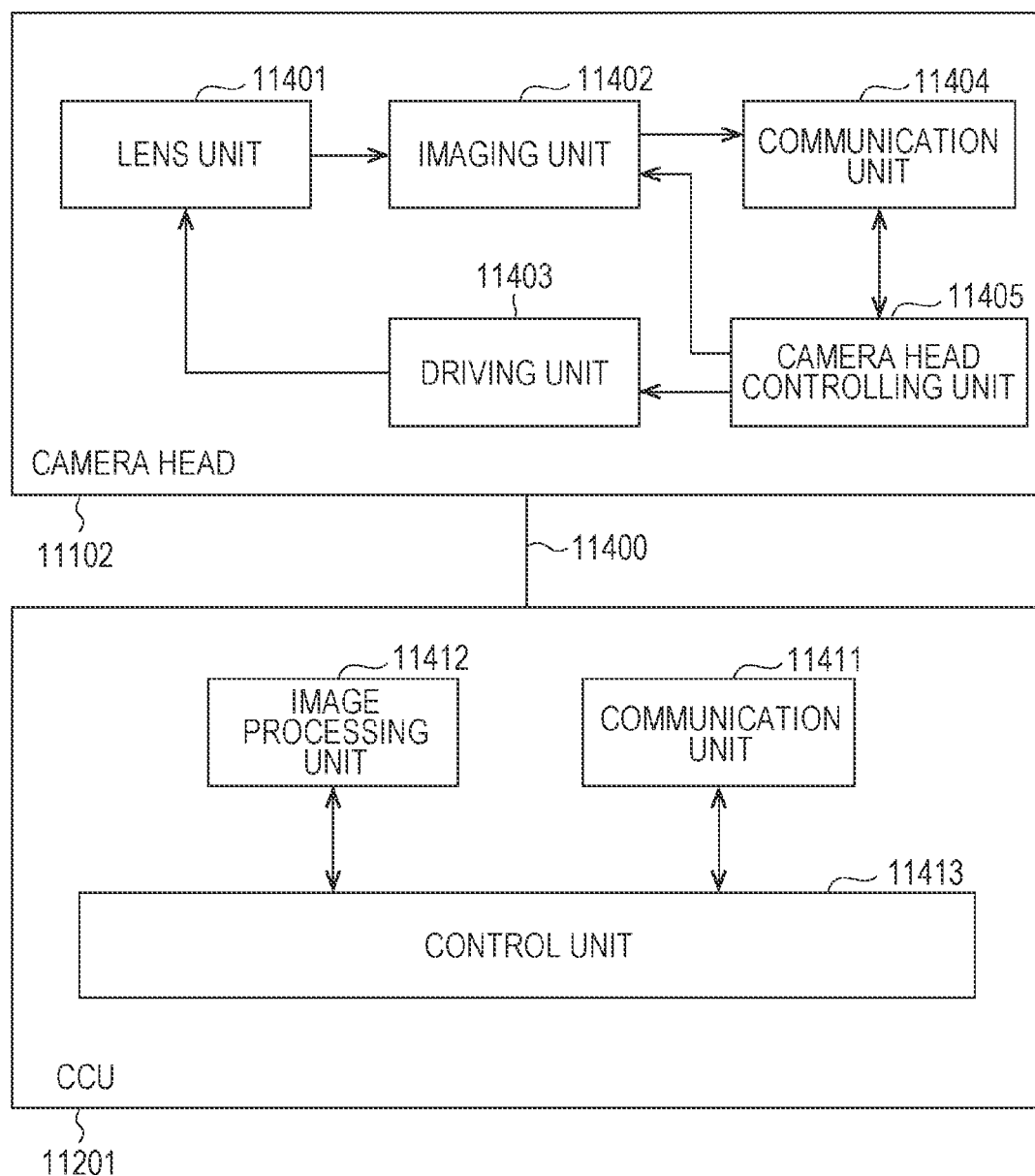
FIG. 11 is a block diagram showing an example of a functional configuration of a camera head and a camera control unit (CCU).

FIG. 11 is a block diagram showing an example of a functional configuration of the camera head 11102 and the CCU 11201 illustrated in FIG. 10.

The camera head 11102 includes a lens unit 11401, an imaging unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The imaging unit 11402 includes imaging elements. The number of imaging elements which is included by the imaging unit 11402 may be one (single-plate type) or a plural number (multi-plate type). Where the imaging unit 11402 is configured as that of the multi-plate type, for example, image signals corresponding to respective R, G and B are generated by the imaging elements, and the image signals may be synthesized to obtain a color image. The imaging unit 11402 may also be configured so as to have a pair of imaging elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the imaging unit 11402 is configured as that of stereoscopic type, a plurality of systems of lens units 11401 are provided corresponding to the individual imaging elements.

Further, the imaging unit 11402 may not necessarily be provided on the camera head 11102. For example, the imaging unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a captured image by the imaging unit 11402 can be adjusted suitably.

The communication unit 11404 includes a communication apparatus for transmitting and receiving various kinds of information to and from the CCU 11201. The communication unit 11404 transmits an image signal acquired from the imaging unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image capturing conditions such as, for example, information that a frame rate of a captured image is designated, information that an exposure value upon image capturing is designated and/or information that a magnification and a focal point of a captured image are designated.

It is to be noted that the image capturing conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image capturing of a surgical region or the like by the endoscope 11100 and display of a captured image obtained by image capturing of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a captured image in which the surgical region or the like is imaged. Thereupon, the control unit 11413 may recognize various objects in the captured image using various image recognition technologies. For example, the control unit 11413 can recognize a surgical tool such as forceps, a particular living body region, bleeding, mist when the energy device 11112 is used and so forth by detecting the shape, color and so forth of edges of objects included in a captured image. The control unit 11413 may cause, when it controls the display apparatus 11202 to display a captured image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example illustrated, communication is performed by wired communication using the transmission cable 11400, the communication between the camera head 11102 and the CCU 11201 may be performed by wireless communication.

Hereinabove, an example of an endoscopic surgery system to which the technology according to the present disclosure can be applied is described. The technology according to the present disclosure can be applied to, of the configuration described above, the endoscope 11100, (the imaging unit 11402 of) the camera head 11102, or the like. Specifically, the solid-state imaging element according to the present technology can be used for the imaging unit 10402. By applying the technology according to the present disclosure to the endoscope 11100, (the imaging unit 11402 of) the camera head 11102, or the like, clearer image of a surgical region can be obtained, for example, and thus a surgeon can confirm the surgical region with certainty.

Note that, although the endoscopic surgery system has been described as an example herein, the technology according to the present disclosure (the present technology) may also be applied to others, for example, a microscope surgery system, and the like.

8. Application Example to Mobile Bodies

The technology according to the present disclosure (present technology) can be applied to various products. For example, the technology according to the present disclosure may be implemented as apparatuses mounted on any type of mobile bodies such as automobiles, electric vehicles, hybrid electric vehicles, motorcycles, bicycles, personal mobilities, airplanes, drones, ships, and robots.

Figure 12:
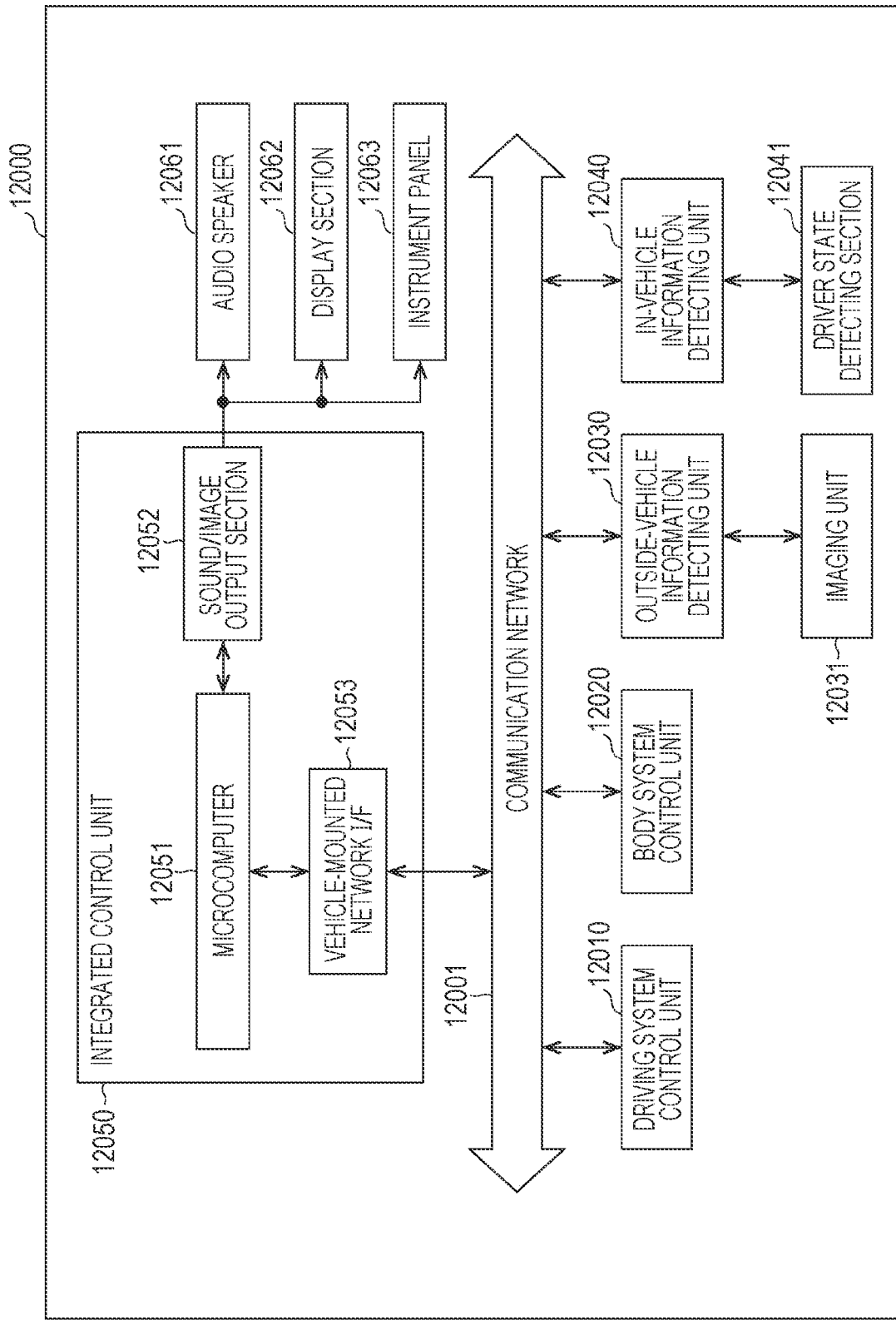
FIG. 12 is a block diagram showing an example of schematic configuration of a vehicle control system.

FIG. 12 is a block diagram showing an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example illustrated in FIG. 12, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying information to an occupant of the vehicle or the outside of the vehicle. In the example of FIG. 12, an audio speaker 12061, a display section 12062, and an instrument panel 12063 are illustrated as the output device. The display section 12062 may, for example, include at least one of an on-board display or a head-up display.

Figure 13:
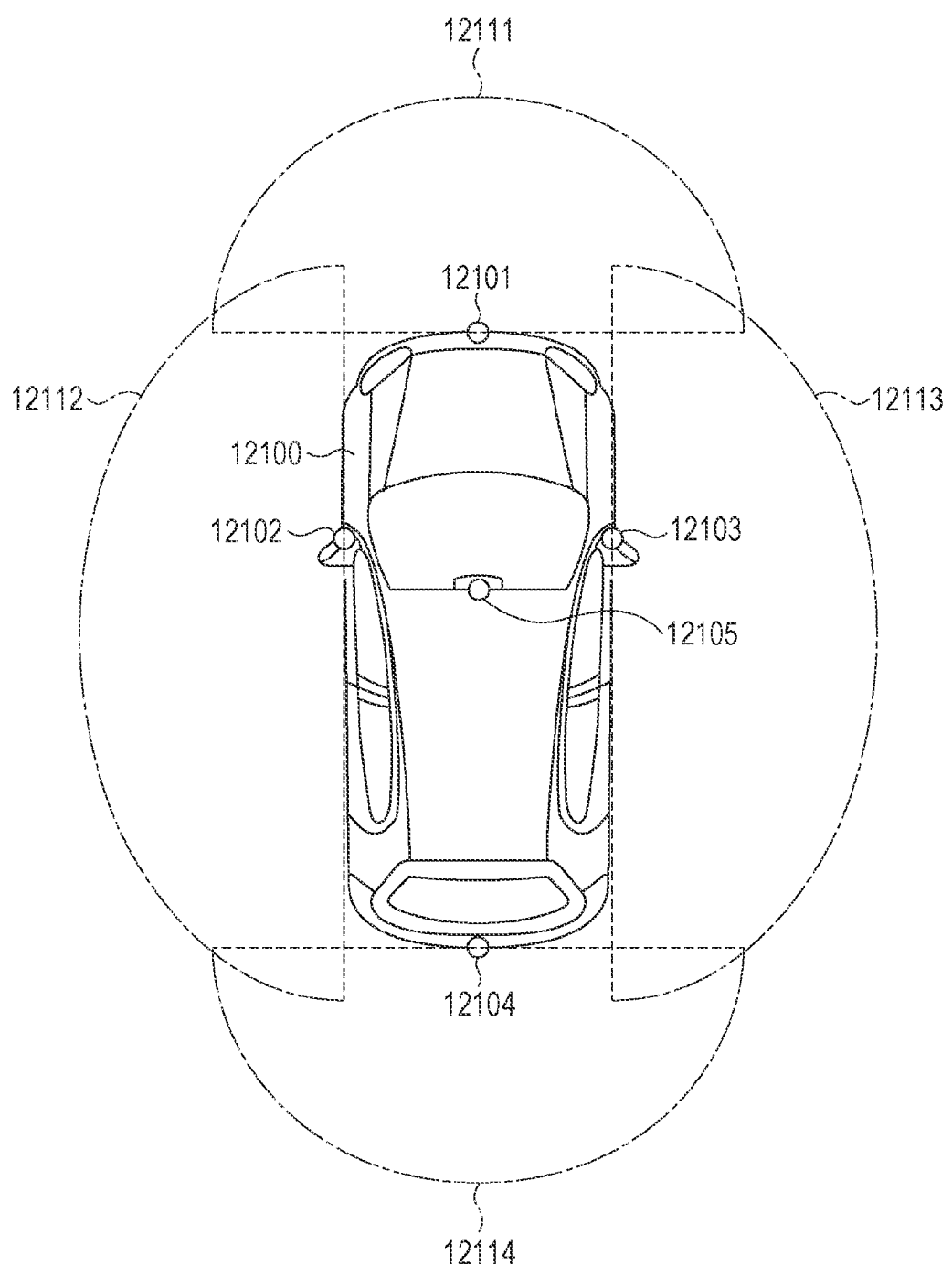
FIG. 13 is a diagram of assistance in explaining an example of installation positions of an outside-vehicle information detecting section and an imaging unit.

FIG. 13 is a diagram showing an example of the installation position of the imaging unit 12031.

In FIG. 13, the vehicle 12100 includes imaging units 12101, 12102, 12103, 12104, and 12105 as the imaging unit 12031.

The imaging units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging unit 12101 provided to the front nose and the imaging unit 12105 provided to the upper portion of the windshield within the interior of the vehicle obtain mainly an image of the front of the vehicle 12100. The imaging units 12102 and 12103 provided to the sideview mirrors obtain mainly an image of the sides of the vehicle 12100. The imaging unit 12104 provided to the rear bumper or the back door obtains mainly an image of the rear of the vehicle 12100. The imaging units 12101 and 12105 provided to the upper portion of the windshield within the interior of the vehicle is used mainly to detect a preceding vehicle, a pedestrian, an obstacle, a signal, a traffic sign, a lane, or the like.

Incidentally, FIG. 13 illustrates an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the sideview mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in captured images of the imaging units 12101 to 12104. Such recognition of a pedestrian is, for example, performed by a procedure of extracting characteristic points in the captured images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the captured images of the imaging units 12101 to 12104, and thus recognizes the pedestrian, the sound/image output section 12052 controls the display section 12062 so that a square contour line for emphasis is displayed so as to be superimposed on the recognized pedestrian. Furthermore, the sound/image output section 12052 may also control the display section 12062 so that an icon or the like representing the pedestrian is displayed at a desired position.

Hereinabove, an example of a vehicle control system to which the technology according to the present disclosure (present technology) can be applied is described. The technology according to the present disclosure can be applied to, of the configuration described above, for example, the imaging unit 12031 or the like. Specifically, the solid-state imaging element according to the present technology can be used for the imaging unit 12031. Easier-to-see captured images can be obtained by applying the technology according to the present disclosure to the imaging unit 12031, and therefore the fatigue of the driver can be reduced.

EXAMPLES

Hereinbelow, the present technology is described more specifically by using Examples; however, the present technology is not limited to the following Examples, to the extent of the gist of the present technology.

Example 1

Experiment 1-1

First, a second oxide semiconductor layer is produced.
A material such as IGZO may be used to produce the second oxide semiconductor layer.

A vacuum sputtering method using an IGZO material as a target is used as a method for forming an IGZO film.

Before the film formation by sputtering, preheating is performed in a room connected to a sputtering chamber through a vacuum conveyance chamber. Adsorbed water of a substrate is eliminated by the preheating. It is desirable that the ultimate vacuum of the preheating chamber be not more than the level of $3 \times 10^{-5}$ Pa, the heating temperature be 250° C., and the treatment time be not less than 1 min.

After the preheating, the workpiece is conveyed to the sputtering chamber by vacuum conveyance.

It is desirable that the degree of vacuum of the sputtering chamber be not more than $3 \times 10^{-5}$ Pa and the distance between the target and the substrate (a TS distance) be 70 to 200 mm. For film formation conditions, Ar gas and oxygen gas are introduced, and the flow rate of Ar gas is set to 50 to 200 sccm and the flow rate of oxygen gas is to 2 to 50 sccm. It is desirable that the gas pressure be 0.2 to 0.5 Pa and the film formation temperature be in the range of room temperature to 300° C. The sputtering discharge may be either of a direct current (DC) magnetron method and an RF magnetron sputtering method using radio frequency.

The parameters of pressure, power, and film formation temperature are adjusted so that the film density after film formation is in the range of 5.90 to 6.15 g/cm$^3$. The film density is found by fitting of a waveform obtained by reflected X-ray intensity measurement.

The film thickness of the second oxide semiconductor layer is adjusted so as to be, for example, 30 to 50 nm.

Next, annealing is performed in a water vapor atmosphere in order to reduce the number of traps.

The annealing in a water vapor atmosphere is performed at atmospheric pressure and in a range of water concentration of 20 to 50%. It is desirable that the annealing temperature be not less than 300° C. and the treatment time be not less than 1 hour. SIMS analysis is performed to make the quantitative measurement of hydrogen concentration in the IGZO film after annealing. The hydrogen concentration in the IGZO film (in the second oxide semiconductor layer) is adjusted so as to be, for example, not less than 1.0E20 atoms/cm² in the entire region of the film thickness.

Experiment 1-2

Next, a first oxide semiconductor layer-1 is produced on the second oxide semiconductor layer.
A material such as IGZO may be used to produce the first oxide semiconductor layer.
A vacuum sputtering method using an IGZO material as a target is used as a method for forming an IGZO film, like for the second oxide semiconductor layer.
It is desirable that the degree of vacuum of the sputtering chamber be not more than $3\times10^{-5}$ Pa and the distance between the target and the substrate (a TS distance) be 70 to 200 mm. For film formation conditions, Ar gas and oxygen gas are introduced, and the flow rate of Ar gas is set to 50 to 200 sccm and the flow rate of oxygen gas is to 10 to 50 sccm in order to form a high density IGZO film layer. It is desirable that the gas pressure be 0.2 to 0.5 Pa and the film formation temperature be in the range of room temperature to 300° C. The sputtering discharge may be either of a direct current (DC) magnetron method and an RF magnetron sputtering method using radio frequency.
The film density of the first oxide semiconductor layer-1 is adjusted so as to be higher than the film density of the second oxide semiconductor layer, and is adjusted so as to be, for example, 6.20 g/cm³.
The film thickness of the first oxide semiconductor layer-1, which is a high density layer, is adjusted so as to be, for example, not less than 5 nm and less than 30 nm.

Experiment 1-3

A photoelectric conversion layer is formed on the first oxide semiconductor layer-1, and then a first electrode (an upper electrode) is formed on the photoelectric conversion layer. Further, a second electrode (a lower electrode) is formed under the second oxide semiconductor layer, and then a semiconductor substrate in which a photoelectric conversion section (for example, an inorganic photoelectric conversion section containing an inorganic-based material) is formed is stacked below the second electrode. Finally, functional elements such as a memory element are provided, and a wiring layer is formed on the front surface side (the surface side on which the photoelectric conversion layer is not formed) of the semiconductor substrate; thus, a solid-state imaging element-1 is manufactured. Note that the photoelectric conversion layer formed on the first oxide semiconductor layer-1 may be an organic semiconductor layer or may be a layer containing an inorganic material as a main component. Further, a p-type buffer layer containing an organic-based material or an inorganic-based material may be formed between the first electrode and the photoelectric conversion layer, and an n-type buffer layer containing an organic-based material or an inorganic-based material may be formed between the photoelectric conversion layer and the first oxide semiconductor layer-1.

Example 2

Experiment 2-1

First, a second oxide semiconductor layer is produced in conformity with the method of experiment 1-1 above.

Experiment 2-2

Next, a first oxide semiconductor layer-2 that is a low hydrogen concentration layer is produced on the second oxide semiconductor layer.
In order to reduce the hydrogen concentration in the film, it is desirable that the ultimate vacuum of the film formation chamber be set to not more than $1\times10^{-5}$ Pa or not more than $5\times10^{-6}$ Pa.

Experiment 2-3

A photoelectric conversion layer is formed on the first oxide semiconductor layer-2, and then a first electrode (an upper electrode) is formed on the photoelectric conversion layer. Further, a second electrode (a lower electrode) is formed under the second oxide semiconductor layer, and then a semiconductor substrate in which a photoelectric conversion section (for example, an inorganic photoelectric conversion section containing an inorganic-based material) is formed is stacked below the second electrode. Finally, functional elements such as a memory element are provided, and a wiring layer is formed on the front surface side (the surface side on which the photoelectric conversion layer is not formed) of the semiconductor substrate; thus, a solid-state imaging element-2 is manufactured. Note that the photoelectric conversion layer formed on the first oxide semiconductor layer-2 may be an organic semiconductor layer or may be a layer containing an inorganic material as a main component. Further, a p-type buffer layer containing an organic-based material or an inorganic-based material may be formed between the first electrode and the photoelectric conversion layer, and an n-type buffer layer containing an organic-based material or an inorganic-based material may be formed between the photoelectric conversion layer and the first oxide semiconductor layer-2.

Example 3

Experiment 3-1

First, a second oxide semiconductor layer is produced in conformity with the method of experiment 1-1 above.

Experiment 3-2

Next, a first oxide semiconductor layer-3 that is a high density layer and is also a low hydrogen concentration layer is produced on the second oxide semiconductor layer.
The film formation conditions are similar to the film formation conditions of the first oxide semiconductor layer-1, which is a high density layer, produced in experiment 1-2 above; however, in order to reduce the hydrogen concentration in the film, it is desirable that the ultimate vacuum of the film formation chamber be set to not more than $1\times10^{-5}$ Pa or not more than $5\times10^{-6}$ Pa.

Experiment 3-3

A photoelectric conversion layer is formed on the first oxide semiconductor layer-3, and then a first electrode (an upper electrode) is formed on the photoelectric conversion layer. Further, a second electrode (a lower electrode) is formed under the second oxide semiconductor layer, and then a semiconductor substrate in which a photoelectric conversion section (for example, an inorganic photoelectric conversion section containing an inorganic-based material) is formed is stacked below the second electrode. Finally, functional elements such as a memory element are provided, and a wiring layer is formed on the front surface side (the surface side on which the photoelectric conversion layer is not formed) of the semiconductor substrate; thus, a solid-state imaging element-3 is manufactured. Note that the photoelectric conversion layer formed on the first oxide semiconductor layer-3 may be an organic semiconductor layer or may be a layer containing an inorganic material as a main component. Further, a p-type buffer layer containing an organic-based material or an inorganic-based material may be formed between the first electrode and the photoelectric conversion layer, and an n-type buffer layer containing an organic-based material or an inorganic-based material may be formed between the photoelectric conversion layer and the first oxide semiconductor layer-3.

Hereinabove, a description is given using embodiments, use examples, application examples, and Examples; however, the subject matter of the present technology is not limited to the above embodiments, the above use examples, the above application examples, or the above Examples, but can be variously modified.

Further, although the above embodiments are described using, as an example, a configuration of a back-side illumination solid-state imaging element, the above embodiments can be applied also to a front-side illumination solid-state imaging element.

Furthermore, the effects described in the present specification are only examples and are not limitative ones, and there may be other effects.

Additionally, the present technology may also be configured as below.

[1]
A solid-state imaging element including at least: a first photoelectric conversion section; and a semiconductor substrate in which a second photoelectric conversion section is formed, in this order from a light incidence side, in which
the first photoelectric conversion section includes at least a first electrode, a photoelectric conversion layer, a first oxide semiconductor layer, a second oxide semiconductor layer, and a second electrode in this order, and
a film density of the first oxide semiconductor layer is higher than a film density of the second oxide semiconductor layer.

[2]
The solid-state imaging element according to [1], in which a hydrogen concentration of the first oxide semiconductor layer is lower than a hydrogen concentration of the second oxide semiconductor layer.

[3]
The solid-state imaging element according to [1] or [2], in which the photoelectric conversion layer contains at least one organic semiconductor material.

[4]
The solid-state imaging element according to any one of [1] to [3], in which the first photoelectric conversion section further includes an n-type buffer layer between the photoelectric conversion layer and the first oxide semiconductor layer.

[5]
The solid-state imaging element according to any one of [1] to [3], in which the first photoelectric conversion section further includes a p-type buffer layer between the first electrode and the photoelectric conversion layer.

[6]
The solid-state imaging element according to any one of [1] to [3], in which
the first photoelectric conversion section further includes an n-type buffer layer between the photoelectric conversion layer and the first oxide semiconductor layer, and
the first photoelectric conversion section further includes a p-type buffer layer between the first electrode and the photoelectric conversion layer.

[7]
A solid-state imaging element including at least: a first photoelectric conversion section; and a semiconductor substrate in which a second photoelectric conversion section is formed, in this order from a light incidence side, in which
the first photoelectric conversion section includes at least a first electrode, a photoelectric conversion layer, a first oxide semiconductor layer, a second oxide semiconductor layer, and a second electrode in this order, and
a hydrogen concentration of the first oxide semiconductor layer is lower than a hydrogen concentration of the second oxide semiconductor layer.

[8]
The solid-state imaging element according to [7], in which a film density of the first oxide semiconductor layer is higher than a film density of the second oxide semiconductor layer.

[9]
The solid-state imaging element according to [7] or [8], in which the photoelectric conversion layer contains at least one organic semiconductor material.

[10]
The solid-state imaging element according to any one of [7] to [9], in which the first photoelectric conversion section further includes an n-type buffer layer between the photoelectric conversion layer and the first oxide semiconductor layer.

[11]
The solid-state imaging element according to any one of [7] to [9], in which the first photoelectric conversion section further includes a p-type buffer layer between the first electrode and the photoelectric conversion layer.

[12]
The solid-state imaging element according to any one of [7] to [9], in which
the first photoelectric conversion section further includes an n-type buffer layer between the photoelectric conversion layer and the first oxide semiconductor layer, and
the first photoelectric conversion section further includes a p-type buffer layer between the first electrode and the photoelectric conversion layer.

[13]
A solid-state imaging element including at least: a first photoelectric conversion section; and a semiconductor substrate in which a second photoelectric conversion section is formed, in this order from a light incidence side, in which
the first photoelectric conversion section includes at least a first electrode, a photoelectric conversion layer, a first oxide semiconductor layer, a second oxide semiconductor layer, and a second electrode in this order,
a film density of the first oxide semiconductor layer is higher than a film density of the second oxide semiconductor layer, and a hydrogen concentration of the first oxide semiconductor layer is lower than a hydrogen concentration of the second oxide semiconductor layer.

[14]

The solid-state imaging element according to [13], in which the photoelectric conversion layer contains at least one organic semiconductor material.

[15]

The solid-state imaging element according to [13] or [14], in which the first photoelectric conversion section further includes an n-type buffer layer between the photoelectric conversion layer and the first oxide semiconductor layer.

[16]

The solid-state imaging element according to [13] or [14], in which the first photoelectric conversion section further includes a p-type buffer layer between the first electrode and the photoelectric conversion layer.

[17]

The solid-state imaging element according to [13] or [14], in which
the first photoelectric conversion section further includes an n-type buffer layer between the photoelectric conversion layer and the first oxide semiconductor layer, and
the first photoelectric conversion section further includes a p-type buffer layer between the first electrode and the photoelectric conversion layer.

[18]

An electronic device including the solid-state imaging element according to any one of [1] to [17].

REFERENCE SIGNS LIST

10 Solid-state imaging element
10A First photoelectric conversion section
11 Second electrode
12 Insulating layer
13 Second oxide semiconductor layer
14 First oxide semiconductor layer
15 Photoelectric conversion layer
16 First electrode
17 p-type buffer layer
18 n-type buffer layer
30 Semiconductor substrate

What is claimed is:

1. A solid-state imaging element comprising at least: a first photoelectric conversion section; and a semiconductor substrate in which a second photoelectric conversion section is formed, in this order from a light incidence side, wherein
the first photoelectric conversion section includes at least a first electrode, a photoelectric conversion layer, a first oxide semiconductor layer, a second oxide semiconductor layer, and a second electrode in this order, and
a film density of the first oxide semiconductor layer is higher than a film density of the second oxide semiconductor layer.

2. The solid-state imaging element according to claim 1, wherein a hydrogen concentration of the first oxide semiconductor layer is lower than a hydrogen concentration of the second oxide semiconductor layer.

3. The solid-state imaging element according to claim 1, wherein the photoelectric conversion layer contains at least one organic semiconductor material.

4. The solid-state imaging element according to claim 1, wherein the first photoelectric conversion section further includes an n-type buffer layer between the photoelectric conversion layer and the first oxide semiconductor layer.

5. The solid-state imaging element according to claim 1, wherein the first photoelectric conversion section further includes a p-type buffer layer between the first electrode and the photoelectric conversion layer.

6. The solid-state imaging element according to claim 1, wherein
the first photoelectric conversion section further includes an n-type buffer layer between the photoelectric conversion layer and the first oxide semiconductor layer, and
the first photoelectric conversion section further includes a p-type buffer layer between the first electrode and the photoelectric conversion layer.

7. An electronic device comprising: the solid-state imaging element according to claim 1.

8. A solid-state imaging element comprising at least: a first photoelectric conversion section; and a semiconductor substrate in which a second photoelectric conversion section is formed, in this order from a light incidence side, wherein
the first photoelectric conversion section includes at least a first electrode, a photoelectric conversion layer, a first oxide semiconductor layer, a second oxide semiconductor layer, and a second electrode in this order, and
a hydrogen concentration of the first oxide semiconductor layer is lower than a hydrogen concentration of the second oxide semiconductor layer.

9. The solid-state imaging element according to claim 8, wherein a film density of the first oxide semiconductor layer is higher than a film density of the second oxide semiconductor layer.

10. The solid-state imaging element according to claim 8, wherein the photoelectric conversion layer contains at least one organic semiconductor material.

11. The solid-state imaging element according to claim 8, wherein the first photoelectric conversion section further includes an n-type buffer layer between the photoelectric conversion layer and the first oxide semiconductor layer.

12. The solid-state imaging element according to claim 8, wherein the first photoelectric conversion section further includes a p-type buffer layer between the first electrode and the photoelectric conversion layer.

13. The solid-state imaging element according to claim 8, wherein
the first photoelectric conversion section further includes an n-type buffer layer between the photoelectric conversion layer and the first oxide semiconductor layer, and
the first photoelectric conversion section further includes a p-type buffer layer between the first electrode and the photoelectric conversion layer.

14. An electronic device comprising: the solid-state imaging element according to claim 7.

15. A solid-state imaging element comprising at least: a first photoelectric conversion section; and a semiconductor substrate in which a second photoelectric conversion section is formed, in this order from a light incidence side, wherein
the first photoelectric conversion section includes at least a first electrode, a photoelectric conversion layer, a first oxide semiconductor layer, a second oxide semiconductor layer, and a second electrode in this order,
a film density of the first oxide semiconductor layer is higher than a film density of the second oxide semiconductor layer, and
a hydrogen concentration of the first oxide semiconductor layer is lower than a hydrogen concentration of the second oxide semiconductor layer.

16. The solid-state imaging element according to claim 15, wherein the photoelectric conversion layer contains at least one organic semiconductor material.

17. The solid-state imaging element according to claim 15, wherein the first photoelectric conversion section further includes an n-type buffer layer between the photoelectric conversion layer and the first oxide semiconductor layer.

18. The solid-state imaging element according to claim 15, wherein the first photoelectric conversion section further includes a p-type buffer layer between the first electrode and the photoelectric conversion layer.

19. The solid-state imaging element according to claim 15, wherein the first photoelectric conversion section further includes an n-type buffer layer between the photoelectric conversion layer and the first oxide semiconductor layer, and the first photoelectric conversion section further includes a p-type buffer layer between the first electrode and the photoelectric conversion layer.

20. An electronic device comprising: the solid-state imaging element according to claim 13.

* * * * *